(12) United States Patent
Soga et al.

(10) Patent No.: US 9,620,429 B2
(45) Date of Patent: Apr. 11, 2017

(54) SEMICONDUCTOR APPARATUS, STACKED SEMICONDUCTOR APPARATUS, ENCAPSULATED STACKED-SEMICONDUCTOR APPARATUS, AND METHOD FOR MANUFACTURING THE SAME

(71) Applicant: SHIN-ETSU CHEMICAL CO., LTD., Tokyo (JP)

(72) Inventors: Kyoko Soga, Annaka (JP); Satoshi Asai, Maebashi (JP); Katsuya Takemura, Jyoetsu (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 0 days.

(21) Appl. No.: 15/163,016

(22) Filed: May 24, 2016

(65) Prior Publication Data
US 2016/0358833 A1 Dec. 8, 2016

(30) Foreign Application Priority Data

Jun. 8, 2015 (JP) ................................. 2015-116000

(51) Int. Cl.
*H01L 29/49* (2006.01)
*H01L 23/29* (2006.01)
(Continued)

(52) U.S. Cl.
CPC ........ *H01L 23/296* (2013.01); *C08G 59/3281* (2013.01); *C08G 59/621* (2013.01);
(Continued)

(58) Field of Classification Search
CPC .. C08G 59/3281; C08G 59/621; C08G 77/52; H01L 23/296
See application file for complete search history.

(56) References Cited

U.S. PATENT DOCUMENTS 5,137,940 A * 8/1992 Tomiyoshi ............... C08K 3/36
523/220
5,739,217 A * 4/1998 Hagiwara ............... C08L 63/00
257/E23.12
(Continued)

FOREIGN PATENT DOCUMENTS

EP 2305754 A1 4/2011
EP 2447304 A1 5/2012
(Continued)

OTHER PUBLICATIONS

Oct. 10, 2016 Extended Search Report issued in European Patent Application No. 16001295.1.

*Primary Examiner* — Michael Shingleton
(74) *Attorney, Agent, or Firm* — Oliff PLC

(57) ABSTRACT

The present invention is a semiconductor apparatus including a semiconductor device, an on-semiconductor-device metal pad and a metal interconnect each electrically connected to the semiconductor device, a through electrode and a solder bump each electrically connected to the metal interconnect, a first photosensitive insulating layer formed on the semiconductor device, and a second photosensitive insulating layer formed on the first photosensitive insulating layer, in which the first and second photosensitive insulating layers are composed of a photo-curable resin composition containing a silicone polymer compound having an epoxy group-containing repeating unit shown by formula (1) and a phenolic hydroxyl group-containing repeating unit shown by formula (2), a photosensitive acid generator, a solvent, and crosslinking agents. There can be provided a semiconductor apparatus that can be easily placed on a circuit board and stacked by forming a fine electrode on the semiconductor device and providing a through electrode outside the semiconductor device.

(Continued)

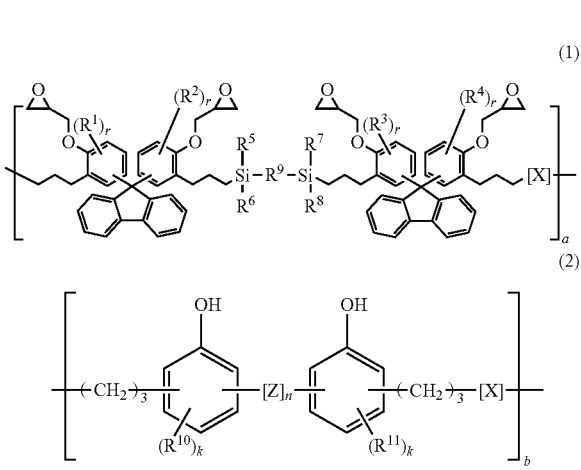

17 Claims, 7 Drawing Sheets

(51) Int. Cl.
| | |
|---|---|
| H01L 25/065 | (2006.01) |
| H01L 25/00 | (2006.01) |
| H01L 21/56 | (2006.01) |
| G03F 7/20 | (2006.01) |
| G03F 7/40 | (2006.01) |
| G03F 7/075 | (2006.01) |
| C08G 59/32 | (2006.01) |
| C08G 59/62 | (2006.01) |
| C08K 5/13 | (2006.01) |
| C08L 63/00 | (2006.01) |
| H01L 23/498 | (2006.01) |
| C08G 77/52 | (2006.01) |
| C08G 77/60 | (2006.01) |
| C09D 183/14 | (2006.01) |
| C09D 183/16 | (2006.01) |
| H01L 21/48 | (2006.01) |
| H01L 25/10 | (2006.01) |

(52) U.S. Cl.
CPC ............. *C08G 77/52* (2013.01); *C08G 77/60* (2013.01); *C08K 5/13* (2013.01); *C08L 63/00* (2013.01); *C09D 183/14* (2013.01); *C09D 183/16* (2013.01); *G03F 7/0757* (2013.01); *G03F 7/20* (2013.01); *G03F 7/40* (2013.01); *H01L 21/4853* (2013.01); *H01L 21/565* (2013.01); *H01L 21/568* (2013.01); *H01L 23/49816* (2013.01); *H01L 23/49827* (2013.01); *H01L 25/0657* (2013.01); *H01L 25/105* (2013.01); *H01L 25/50* (2013.01); *H01L 2224/04105* (2013.01); *H01L 2224/06182* (2013.01); *H01L 2224/12105* (2013.01); *H01L 2224/16145* (2013.01); *H01L 2225/06513* (2013.01); *H01L 2225/06548* (2013.01); *H01L 2225/06565* (2013.01); *H01L 2225/06582* (2013.01)

(56) References Cited

U.S. PATENT DOCUMENTS

| | | | |
|---|---|---|---|
| 6,664,318 B1* | 12/2003 | Bymark | ............... C08L 101/02 257/E23.119 |
| 9,312,074 B2* | 4/2016 | Chacko | ............... H01G 9/0036 |
| 2005/0260522 A1 | 11/2005 | Weber et al. | |
| 2007/0045746 A1 | 3/2007 | Sunohara et al. | |
| 2008/0182087 A1 | 7/2008 | Kato et al. | |
| 2009/0215222 A1 | 8/2009 | Arai et al. | |
| 2010/0244242 A1 | 9/2010 | Komatsu et al. | |
| 2011/0143092 A1 | 6/2011 | Asai et al. | |
| 2011/0298110 A1 | 12/2011 | Pagaila et al. | |
| 2013/0026650 A1 | 1/2013 | Yamagata et al. | |

FOREIGN PATENT DOCUMENTS

| | | |
|---|---|---|
| EP | 2551904 A1 | 1/2013 |
| EP | 2602661 A1 | 6/2013 |
| JP | 2007-067016 A | 3/2007 |
| JP | 2007-522531 A | 8/2007 |
| JP | 2008-184571 A | 8/2008 |
| JP | 2009-200315 A | 8/2009 |
| JP | 2010-245509 A | 10/2010 |
| JP | 2013-030593 A | 2/2013 |

* cited by examiner

SEMICONDUCTOR APPARATUS, STACKED SEMICONDUCTOR APPARATUS, ENCAPSULATED STACKED-SEMICONDUCTOR APPARATUS, AND METHOD FOR MANUFACTURING THE SAME

TECHNICAL FIELD

The present invention relates to a semiconductor apparatus, a stacked semiconductor apparatus, an encapsulated stacked-semiconductor apparatus, and methods for manufacturing these.

BACKGROUND ART

As various electronic devices including a personal computer, a digital camera, and a mobile phone progress toward downsizing and higher performance, requirements are rapidly increasing for further downsizing, thinning, and higher density in a semiconductor device. Accordingly, it is desired to develop a photosensitive insulating material, a stacked semiconductor apparatus, and a method for manufacturing the same that can cope with an increase in surface area of a substrate for the sake of higher productivity, and can be used in high density mounting technologies including a chip size package or a chip scale package (CSP) and a three-dimensional lamination.

As the photosensitive insulating material, there has been proposed a photo-curable resin composition that can be applied with a wide range of film thickness by a spin coating method, which is commonly used in the semiconductor device fabrication, be processed into a fine pattern with a wide range of wavelength, and be post-cured at low temperature into a top coat having excellent flexibility, heat resistance, electric characteristics, adhesiveness, reliability, and chemical resistance to protect electric and electronic parts (PATENT LITERATURE 1). However, when the photo-curable resin composition is applied onto a substrate having an uneven surface by the spin coating method, the composition is difficult to coat the substrate uniformly. This easily causes the photo-curable resin layer to have voids on an uneven portion of the substrate. It would therefore be desirable to improve planarity and step coverage.

As the alternative coating method of the spin coating method, a spray method has been proposed (PATENT LITERATURE 2). In principle, however, this method easily causes defects such as height difference due to unevenness of the substrate, film loss at pattern edge, and a pinhole in a recess bottom. In addition, when the substrate has large variation in height, the composition exhibits high viscosity for obtaining a required film thickness. Thus, the problems of planarity and step coverage still remain unsolved.

Besides, there has been proposed a photo-curable resin composition containing a multifunctional epoxy resin and a phenolic curing agent, which allows patterning with high aspect ratio (PATENT LITERATURE 3). A dry film 1 to 100 μm thick using this composition and use of these materials also have been proposed therein. Unfortunately, this resin has large internal stress, and is required to be improved in flexibility. Additionally, since the resin is poor in transparency, light absorption would occur in the film, the sensitivity at the time of patterning of a thick film would be lowered, and an exposure energy difference would be generated between the resist surface and bottom due to absorption by the film itself. This causes problems of deterioration of shape (rectangularity), non-uniform sensitivity in the plane of the substrate having a considerably uneven surface.

Conventionally, examples of a method for manufacturing a semiconductor apparatus by connecting an electrode formed on a semiconductor device to an interconnect pattern formed on a substrate includes connection between the semiconductor device and the substrate by wire bonding. However, the connection between the semiconductor device and the substrate by wire bonding requires a space for drawing metal wire on the semiconductor device. This makes the apparatus large, resulting in difficulty downsizing.

PATENT LITERATURE 4 discloses an example of the method for manufacturing a semiconductor apparatus including a semiconductor device, such as light-emitting device and light-receiving device. In this example, as shown in FIG. 19, a semiconductor apparatus 50 is manufactured by connecting an Aluminum (Al) electrode pad 55 to a redistribution pattern 52 through a through electrode 56 and connecting the redistribution pattern 52 to a redistribution pattern 57 on a circuit board 53 through a solder bump 58. A device-forming layer 59 and multiple Al electrode pads 55 are formed on the upper surface of the semiconductor apparatus. A through hole 54 penetrating the semiconductor apparatus is provided between the Al electrode pad 55 and the redistribution pattern 52 by dry etching. The through electrode 56 is formed within the through hole 54 by plating with copper. The device-forming layer 59 is placed on the upper surface of the semiconductor apparatus to emit or receive light.

This method does not require the connection between the semiconductor device and the circuit board by wire bonding, but requires rewiring on the semiconductor apparatus and placing the solder bump. Thus, fine rewiring and highly dense solder bump are required with downsizing of the semiconductor apparatus, resulting in difficulty in practice.

PATENT LITERATURE 5 discloses a method for manufacturing a semiconductor apparatus useful for three-dimensional stacking of multiple semiconductor devices and also discloses an exemplary structure in which a semiconductor device 180 and a semiconductor device 280 are stacked, as shown in FIG. 20.

Each semiconductor device (180, 280) to be stacked is connected to a substrate (110, 210) including a core material (150, 250), a through electrode (140, 240), and an interconnect layer (157, 257) through a solder bump (170, 270) and a pad (182, 282) of the semiconductor device. The interconnect layer (157, 257) includes a mounting pad (165, 265), a connecting pad (164, 264), and an interconnect (266). A space between the outermost surface of the substrate (110, 210) and the semiconductor device (180, 280) is filled with an under fill (184, 284). PATENT LITERATURE 5 discloses a method for connecting and stacking, through solder bumps (174, 176), such substrates each connected to the semiconductor device.

However, PATENT LITERATURE 5, in which the semiconductor device is connected to the circuit board through a solder bump, also considerably requires highly dense solder bumps with downsizing of the semiconductor device as in PATENT LITERATURE 4, resulting in difficulty in practice. In addition, the through electrode provided in the second substrate 210 is difficult to be formed since this formation requires complicated steps.

PATENT LITERATURE 6 discloses examples of a semiconductor apparatus placed on a circuit board, a method for manufacturing the same, a semiconductor apparatus including stacked semiconductor devices, and a method for manufacturing the same. PATENT LITERATURE 6 discloses a semiconductor apparatus, as shown in FIG. 21, including an organic substrate 301, through vias 304 which penetrate the organic substrate 301 in its thickness direction, external electrodes 305b and internal electrodes 305a provided to the front and back faces of the organic substrate 301 and electrically connected to the through vias 304, a semiconductor device 302 mounted on one main surface of the organic substrate 301 via a bonding layer 303, with a device circuit surface thereof facing upward, an insulating material layer 306 for encapsulating the semiconductor device 302 and a periphery thereof, a metal thin film wiring layer 307 provided in the insulating material layer 306, with a part of this metal thin film wiring layer being exposed on an external surface, metal vias 310 electrically connected to the metal thin film wiring layer 307, and external electrodes 309 formed on the metal thin film wiring layer 307, in which the metal thin film wiring layer 307 is structured such that the electrodes disposed on the device circuit surface of the semiconductor device 302, the internal electrodes 305a, the metal vias 310, and the external electrodes 309 formed on the metal thin film wiring layer 307 are electrically connected. PATENT LITERATURE 6 also discloses methods for manufacturing this semiconductor apparatus placed on a circuit board and a semiconductor apparatus including multiple semiconductor devices being stacked. The method of PATENT LITERATURE 6 does not require to form many solder bumps on the semiconductor device, and thus can form many electrodes on the semiconductor device with high density, thereby achieving downsizing of the semiconductor apparatus.

However, a structure of the semiconductor apparatus disclosed in PATENT LITERATURE 6 still has difficulty in processing to form the through vias 304 toward the circuit board. Although processing with a micro-hole drill and processing with laser are disclosed therein, these processing techniques are still unsatisfactory for miniaturization of the semiconductor apparatus to be expected.

In addition, PATENT LITERATURE 6 discloses, as shown in FIG. 22, patterning a photosensitive resin layer 316 applied on the surface of the semiconductor device to form openings 317 for vias 308 to be formed on the semiconductor device 302. The insulating material layer 306 on the periphery of the semiconductor device is formed by, for example, spin coating. In practice, however, this method requires complicated steps of providing the resin twice for coating the semiconductor device 302 with the photosensitive resin layer 316 and for forming the insulating material layer 306 on the periphery of the semiconductor device 302. Moreover, when spin coating is carried out to provide the insulating material layer 306, a height of a semiconductor device 302 is important. In case that a semiconductor device 302 having a height exceeding several tens of μm is required, it is practically difficult to get over the semiconductor device and then provide the insulating material layer 306 by spin coating without voids. This publication also discloses an example in which the vias 308 of the photosensitive resin layer 316 and the metal vias 310 of the insulating material layer 306 are separately formed by different steps, and an example in which the metal vias 310 are processed with laser, but these steps are complicated and not rational. The publication also discloses that the photosensitive resin layer 316 and the insulating material layer 306 can be simultaneously provided on the periphery of the semiconductor device 302 and on the circuit surface, but fails to disclose illustrative examples of this method. It is difficult to provide these resin layers without generating voids on the periphery of the semiconductor device. Furthermore, the publication also discloses that the vias 308 of the photosensitive resin layer 316 and the metal vias 310 of the insulating material layer 306 can be simultaneously formed, but fails to disclose illustrative examples of this method.

CITATION LIST

Patent Literature

PATENT LITERATURE 1: Japanese Patent Laid-Open Publication No. 2008-184571
PATENT LITERATURE 2: Japanese Patent Laid-Open Publication No. 2009-200315
PATENT LITERATURE 3: Japanese Patent Laid-Open Publication No. 2007-522531
PATENT LITERATURE 4: Japanese Patent Laid-Open Publication No. 2007-67016
PATENT LITERATURE 5: Japanese Patent Laid-Open Publication No. 2010-245509
PATENT LITERATURE 6: Japanese Patent Laid-Open Publication No. 2013-30593

SUMMARY OF THE INVENTION

Technical Problem

The present invention was accomplished in view of the above circumstances, and has an object to provide a semiconductor apparatus that can be easily placed on a circuit board and stacked by forming a fine electrode on the semiconductor device and providing a through electrode outside the semiconductor device.

Another object is to provide a method for manufacturing a semiconductor apparatus that facilitates processing a through electrode, openings of an electrode pad portion and the like, at the time of manufacturing the semiconductor apparatus.

Further object is to provide a stacked semiconductor apparatus including such semiconductor apparatuses being stacked, an encapsulated stacked-semiconductor apparatus obtained by placing the stacked semiconductor apparatus on a circuit board and encapsulating it, and methods for manufacturing these.

Solution to Problem

To solve the above-mentioned problems, the present invention provides a semiconductor apparatus comprising: a semiconductor device; an on-semiconductor-device metal pad electrically connected to the semiconductor device; a metal interconnect electrically connected to the semiconductor device; a through electrode electrically connected to the metal interconnect; a solder bump electrically connected to the metal interconnect; a first photosensitive insulating layer formed on the semiconductor device; and a second photosensitive insulating layer formed on the first photosensitive insulating layer, wherein the first photosensitive insulating layer and the second photosensitive insulating layer are composed of a photo-curable resin composition containing (A) a silicone polymer compound having an epoxy group-containing repeating unit shown by the following general formula (1) and a phenolic hydroxyl group-containing repeating unit shown by the following general formula (2), wherein the silicone polymer compound has a weight aver age molecular weight of 3,000 to 500,000 and satisfies 0.05≤J/(J+K)≤0.95 where J is a mole of epoxy groups in the general formula (1) and K is a mole of phenolic hydroxyl groups in the general formula (2), wherein $R^{12}$, $R^{13}$, $R^{14}$, and $R^{15}$ may be the same or different and represent a monovalent hydrocarbon group having 1 to 10 carbon atoms; and m represents a positive number of 1 to 100,

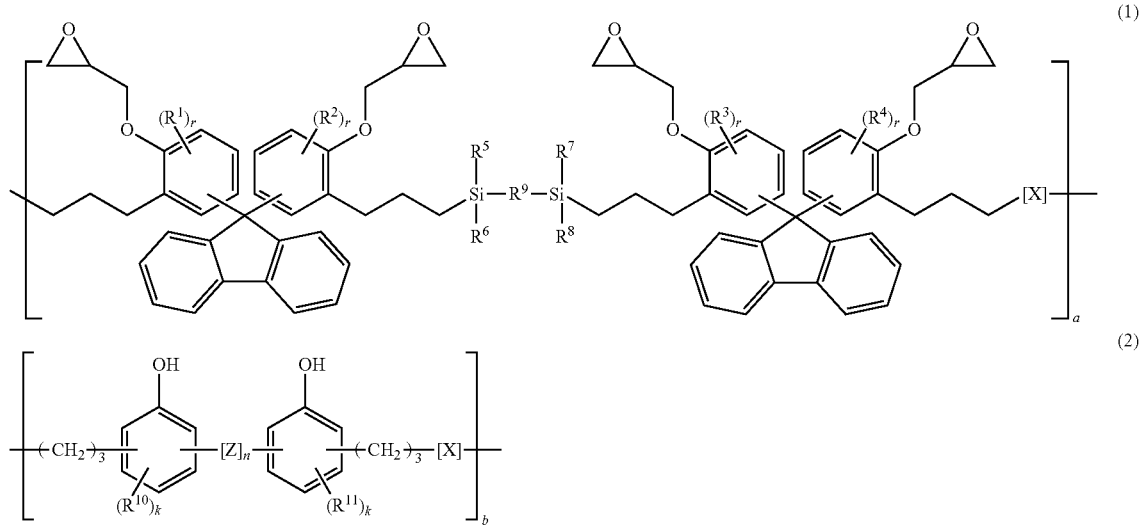

wherein a and b represent a positive number; $R^1$, $R^2$, $R^3$, and $R^4$ may be the same or different and represent a hydrogen atom or an alkyl or alkoxy group having 1 to 4 carbon atoms; r independently represents 0, 1, or 2; $R^5$ to $R^8$ independently represent a hydrogen atom or a monovalent hydrocarbon group having 1 to 10 carbon atoms; $R^9$ represents a divalent hydrocarbon group having 1 to 10 carbon atoms; n represents 0 or 1; k represents 0, 1, or 2; $R^{10}$ and $R^{11}$ may be the same or different and represent an alkyl or alkoxy group having 1 to 4 carbon atoms; Z represents a divalent organic group selected from any of

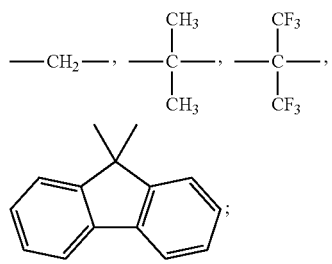

and X represents a divalent organic group shown by the following formula (3) or the following general formula (4),

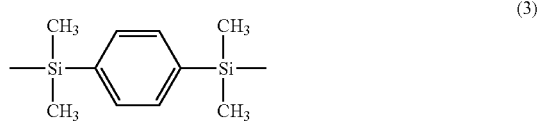

(B) a photosensitive acid generator capable of generating an acid by decomposition with light having a wavelength of 190 to 500 nm, (C) a solvent, (D) one or two or more compounds selected from an amino condensate modified with formaldehyde or formaldehyde-alcohol, a phenol compound having on average two or more methylol groups or alkoxymethylol groups per molecule, and a polyhydric phenol compound whose phenolic hydroxyl group is substituted with a glycidoxy group, and (E) one or two or more compounds selected from polyhydric phenols having 3 or more hydroxyl groups.

Such a semiconductor apparatus can be easily placed on a circuit board and stacked by forming the fine electrode on the semiconductor device and providing the through electrode outside the semiconductor device. In addition, the first photosensitive insulating layer and the second photosensitive insulating layer composed of the above photo-curable resin composition can reduce warpage of the semiconductor apparatus.

The photo-curable resin composition preferably further contains (F) a basic compound.

Blending the basic compound in the photo-curable resin composition enhances resolution of the first photosensitive insulating layer and the second photosensitive insulating layer, reduces the change of sensitivity after exposure, decreases dependence on a substrate and an environment, and thus improves exposure margin, pattern profile, and the like.

A cured product of the photo-curable resin composition preferably has an elastic modulus of 0.1 to 2 GPa and a tensile strength of 1 to 80 MPa.

The semiconductor apparatus including the first photosensitive insulating layer and the second photosensitive insulating layer composed of such a photo-curable resin composition is more excellent in durability.

The first photosensitive insulating layer is preferably formed of a photo-curable dry film, and the second photosensitive insulating layer is preferably formed of the photo-curable dry film or a photo-curable resist coating film.

This allows the semiconductor apparatus to be filled without voids on the periphery of the semiconductor device, even when the semiconductor device has a height of several tens of μm.

Furthermore, the present invention provides a stacked semiconductor apparatus, comprising a plurality of the above semiconductor apparatuses, the semiconductor apparatuses being stacked by flip chip.

The inventive semiconductor apparatus can be easily stacked, and thus is suitable for such a stacked semiconductor apparatus.

Furthermore, the present invention provides an encapsulated stacked-semiconductor apparatus, comprising the above stacked semiconductor apparatus placed on a substrate having an electric circuit, the stacked semiconductor apparatus being encapsulated with an insulating encapsulating resin layer.

The inventive semiconductor apparatus can be easily placed on a circuit board and stacked, and thus is suitable for such an encapsulated stacked-semiconductor apparatus.

Furthermore, the present invention provides a method for manufacturing a semiconductor apparatus, comprising the steps of:

(1) preparing a photo-curable dry film comprising a photo-curable resin layer sandwiched between a supporting film and a protective film, the photo-curable resin layer having a thickness of 10 to 300 μm and being composed of a resist composition;

(2) forming a first photosensitive insulating layer by laminating the photo-curable resin layer of the photo-curable dry film on a substrate including a semiconductor device adhering or temporarily adhering to an upper surface of the substrate such that the semiconductor device is covered with the photo-curable resin layer, the semiconductor device having a height of 20 to 100 μm and including an exposed electrode pad;

(3) patterning the first photosensitive insulating layer by lithography through a mask to simultaneously form an opening on the electrode pad and an opening for forming a through electrode provided outside the semiconductor device;

(4) after patterning, baking a pattern obtained by the patterning of the first photosensitive insulating layer to cure the pattern;

(5) after curing, forming a seed layer by sputtering and then filling the opening on the electrode pad and the opening for forming a through electrode by plating to form an on-semiconductor-device metal pad and a through electrode respectively, and connecting the on-semiconductor-device metal pad and the through electrode formed by plating through a metal interconnect formed by plating;

(6) after forming the metal interconnect, forming a second photosensitive insulating layer by laminating the photo-curable resin layer of the photo-curable dry film or applying the resist composition, and patterning the second photosensitive insulating layer to form an opening on the through electrode;

(7) after patterning, baking a pattern obtained by the patterning of the second photosensitive insulating layer to cure the pattern; and (8) after curing, forming a solder bump in the opening on the through electrode, wherein the resist composition constituting the photo-curable resin layer of the photo-curable dry film prepared in the step (1) is a chemically amplified negative resist composition containing (A) a silicone polymer compound having an epoxy group-containing repeating unit shown by the following general formula (1) and a phenolic hydroxyl group-containing repeating unit shown by the following general formula (2), wherein the silicone polymer compound has a weight average molecular weight of 3,000 to 500,000 and satisfies $0.05 \leq J/(J+K) \leq 0.95$ where J is a mole of epoxy groups in the general formula (1) and K is a mole of phenolic hydroxyl groups in the general formula (2),

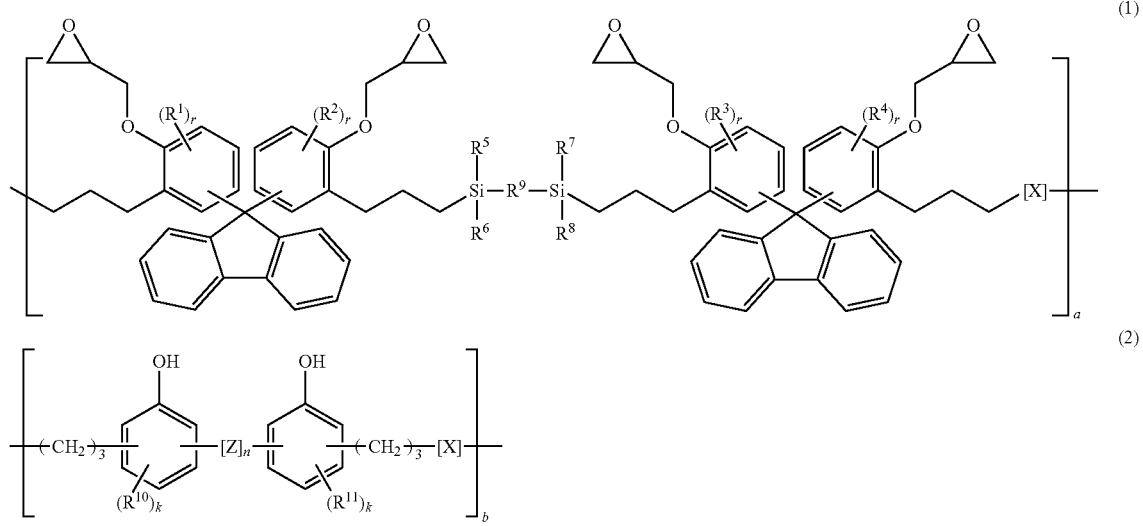

wherein a and b represent a positive number; $R^1$, $R^2$, $R^3$, and $R^4$ may be the same or different and represent a hydrogen atom or an alkyl or alkoxy group having 1 to 4 carbon atoms; r independently represents 0, 1, or 2; $R^5$ to $R^8$ independently represent a hydrogen atom or a monovalent hydrocarbon group having 1 to 10 carbon atoms; $R^9$ represents a divalent hydrocarbon group having 1 to 10 carbon atoms; n represents 0 or 1; k represents 0, 1, or 2; $R^{10}$ and $R^{11}$ may be the same or different and represent an alkyl or alkoxy group having 1 to 4 carbon atoms; Z represents a divalent organic group selected from any of

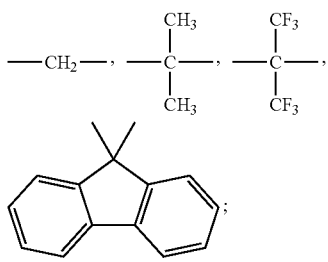

and X represents a divalent organic group shown by the following formula (3) or the following general formula (4),

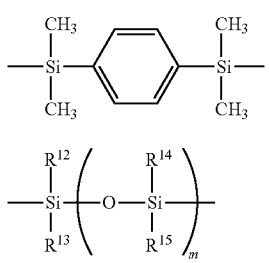

wherein $R^{12}$, $R^{13}$, $R^{14}$, and $R^{15}$ may be the same or different and represent a monovalent hydrocarbon group having 1 to 10 carbon atoms; and m represents a positive number of 1 to 100, (B) a photosensitive acid generator capable of generating an acid by decomposition with light having a wavelength of 190 to 500 nm, (C) a solvent, (D) one or two or more compounds selected from an amino condensate modified with formaldehyde or formaldehyde-alcohol, a phenol compound having on average two or more methylol groups or alkoxymethylol groups per molecule, and a polyhydric phenol compound whose phenolic hydroxyl group is substituted with a glycidoxy group, and (E) one or two or more compounds selected from polyhydric phenols having 3 or more hydroxyl groups.

Such a method for manufacturing a semiconductor apparatus facilitates placing the semiconductor apparatus on a circuit board and stacking the semiconductor apparatuses by forming the fine electrode on the semiconductor device and providing the through electrode outside the semiconductor device. This method also facilitates processing the through electrode, the openings of the electrode pad portion and the like. In addition, use of the photo-curable dry film including the photo-curable resin layer composed of the chemically amplified negative resist composition containing the components (A) to (E) allows the semiconductor apparatus to be filled without voids on the periphery of the semiconductor device, even when the semiconductor device has a height of several tens of μm. In addition, use of the photo-curable dry film can reduce warpage of the semiconductor apparatus, which is expected to occur when the semiconductor apparatus is diced into individual pieces, and thus facilitates stacking the individual semiconductor apparatuses and placing it on a circuit board.

The resist composition preferably further contains (F) a basic compound.

Blending the basic compound in the resist composition enhances resolution of the first photosensitive insulating layer and the second photosensitive insulating layer, reduces the change of sensitivity after exposure, decreases dependence on a substrate and an environment, and thus improves exposure margin, pattern profile, and the like.

A cured product of the resist composition preferably has an elastic modulus of 0.1 to 2 GPa and a tensile strength of 1 to 80 MPa.

Use of the photo-curable dry film including the photo-curable resin layer composed of the chemically amplified negative resist composition containing such a photo-curable resin composition enables a semiconductor apparatus having more excellent durability to be manufactured.

The step (2) preferably includes mechanically pressing the first photosensitive insulating layer.

This allows the first photosensitive insulating layer on the semiconductor device to have thin and uniform thickness, thus enabling the first photosensitive insulating layer to be flatten.

The step (8) may include forming an on-through-electrode metal pad in the opening on the through electrode by plating, and forming a solder ball on the on-through-electrode metal pad for the solder bump. In this manner, the solder bump can be formed in the opening on the through electrode.

Plating to form the through electrode in the step (5) may include plating with SnAg, the step (6) may include patterning to form the opening on the through electrode such that the SnAg plating is uncovered, and the step (8) may include melting the SnAg plating and thereby forming a protruding electrode in the opening on the through electrode for the solder bump. In this manner, the solder bump can be formed in the opening on the through electrode more easily and rationally.

The method may further comprises the steps of, after the step (8), removing the substrate, which has been temporarily adhered to the semiconductor device in the step (2), and after removing the substrate, dicing the semiconductor apparatus into individual pieces. In this manner, individual semiconductor apparatuses can be manufactured.

A stacked semiconductor apparatus can be manufactured by a method comprising stacking a plurality of individual semiconductor apparatuses obtained by dicing in the above manufacturing method, while putting an insulting resin layer between the individual semiconductor apparatuses such that the individual semiconductor apparatuses are electrically connected through the solder bump.

Furthermore, an encapsulated stacked-semiconductor apparatus can be formed by a method comprising the steps of:

placing a stacked semiconductor apparatus manufactured by the above manufacturing method on a substrate having an electric circuit; and encapsulating the stacked semiconductor apparatus placed on the substrate with an insulating encapsulating resin layer.

Advantageous Effects of Invention

As mentioned above, the inventive semiconductor apparatus can be easily placed on a circuit board and stacked by forming the fine electrode on the semiconductor device and providing the through electrode outside the semiconductor device. This semiconductor apparatus is filled without voids on the periphery of the semiconductor device even when the semiconductor device has a height of several tens of μm, and thus inhibited from warping.

Moreover, the inventive method for manufacturing a semiconductor apparatus facilitates placing the semiconductor apparatus on a circuit board and stacking the semiconductor apparatuses by forming the fine electrode on the semiconductor device and providing the through electrode outside the semiconductor device. This method also facilitates processing the through electrode, the openings of the electrode pad portion and the like.

Moreover, the inventive semiconductor thus obtained can be easily placed on a circuit board and stacked, and thus can be used for a stacked semiconductor apparatus including the semiconductor apparatuses being stacked and for an encapsulated stacked-semiconductor apparatus including the stacked semiconductor apparatus placed on a circuit board and then encapsulated.

DESCRIPTION OF EMBODIMENTS

Figure 1:
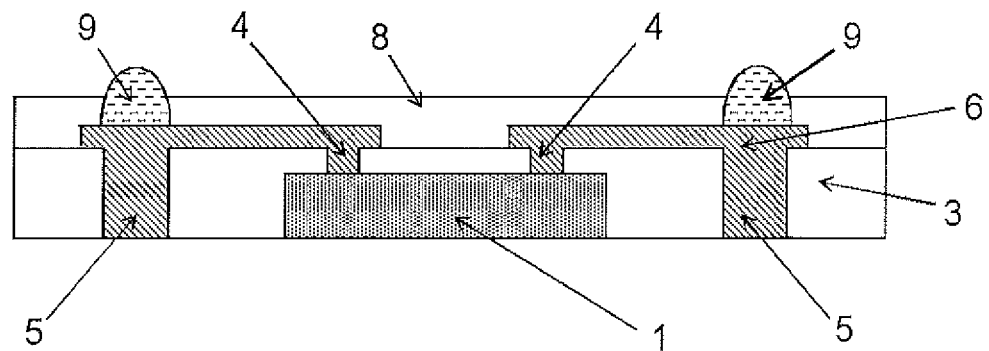
FIG. 1 is a cross-sectional view showing an example of the inventive semiconductor apparatus.

As mentioned above, requirements are rapidly increasing for further downsizing, thinning, and higher density in a semiconductor apparatus, and it is desired to develop a semiconductor apparatus and a method for manufacturing the same that can be easily placed on a circuit board and stacked by forming a fine electrode on the semiconductor device and providing a through electrode outside the semiconductor device.

The present inventors have earnestly investigated to achieve the above object, and consequently found the following. When a photo-curable resin layer of a photo-curable dry film, in which the photo-curable resin layer has a thickness of 10 to 300 μm and is composed of a resist composition containing a silicone polymer compound having an epoxy group-containing repeating unit and a phenolic hydroxyl group-containing repeating unit, is laminated on the periphery of a semiconductor device adhering or temporarily adhering to a substrate, the periphery of the semiconductor device can be filled with the photo-curable resin layer (first photosensitive insulating layer) without voids. In addition, when the laminated photo-curable resin layer is patterned by lithography through a mask, the opening on the electrode pad on the semiconductor device and the opening for forming a through electrode provided outside the semiconductor device can be simultaneously formed. The present invention was thereby brought to completion.

Furthermore, the semiconductor apparatus can be manufactured much rationally by a method that includes: patterning to simultaneously form an opening on the electrode pad on the semiconductor device and an opening for forming a through electrode provided outside the semiconductor device; forming an electric interconnect in the opening pattern by plating, forming a second photosensitive insulating layer by laminating the photo-curable resin layer of the photo-curable dry film or applying the photo-curable resin composition identical to the above-mentioned materials; patterning it; forming a solder bump on the through electrode; and optionally, removing the substrate, which has been adhered, with a temporary adhesive, to the semiconductor apparatus including the semiconductor device, the photo-curable resin layer, and the through electrode; and dicing the semiconductor apparatus into individual pieces. This method can achieve the object of the present invention.

The semiconductor apparatus obtained by the above manufacturing method has the protruding solder bump on the upper portion and the through electrode, which can be easily uncovered by removing the substrate, on the lower portion. Thus, a plurality of the semiconductor apparatuses can be easily electrically connected and stacked by using the solder bump and the uncovered electrode. This stacked semiconductor apparatus can be easily placed on a circuit board. From these findings, the present invention was further brought to completion.

That is, the present invention is a semiconductor apparatus including a semiconductor device; an on-semiconductor-device metal pad electrically connected to the semiconductor device; a metal interconnect electrically connected to the semiconductor device; a through electrode electrically connected to the metal interconnect; a solder bump electrically connected to the metal interconnect; a first photosensitive insulating layer formed on the semiconductor device; and a second photosensitive insulating layer formed on the first photosensitive insulating layer, in which the first photosensitive insulating layer and the second photosensitive insulating layer are composed of the photo-curable resin composition containing the components (A) to (E) described below.

Hereinafter, embodiments of the present invention will be specifically with reference to drawings, but the present invention is not limited thereto.

The inventive semiconductor apparatus includes, as shown in FIG. 1, a semiconductor device 1, an on-semiconductor-device metal pad 4 and a metal interconnect 6 each electrically connected to the semiconductor device 1, a through electrode 5 and a solder bump 9 each electrically connected to the metal interconnect 6, a first photosensitive insulating layer 3 formed on the semiconductor device 1, and a second photosensitive insulating layer 8 formed on the first photosensitive insulating layer 3.

Such a semiconductor apparatus can be easily placed on a circuit board and stacked by forming the fine electrode on the semiconductor device and providing the through electrode outside the semiconductor device. In addition, the through electrode, the openings of the electrode pad portion and the like can be easily processed.

In the inventive semiconductor apparatus, the first photosensitive insulating layer 3 and the second photosensitive insulating layer 8 are composed of a photo-curable resin composition containing (A) a silicone polymer compound having an epoxy group-containing repeating unit shown by the following general formula (1) and a phenolic hydroxyl group-containing repeating unit shown by the following general formula (2), wherein the silicone polymer compound has a weight average molecular weight of 3,000 to 500,000 and satisfies $0.05 \leq J/(J+K) \leq 0.95$ where J is a mole of epoxy groups in the general formula (1) and K is a mole of phenolic hydroxyl groups in the general formula (2),

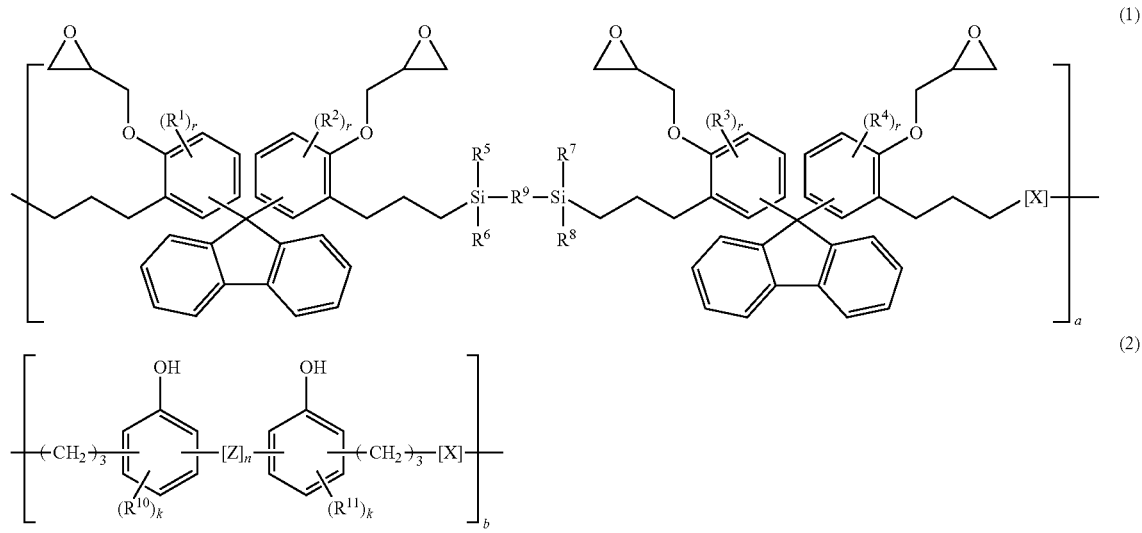

wherein a and b represent a positive number; $R^1$, $R^2$, $R^3$, and $R^4$ may be the same or different and represent a hydrogen atom or an alkyl or alkoxy group having 1 to 4 carbon atoms; r independently represents 0, 1, or 2; $R^5$ to $R^8$ independently represent a hydrogen atom or a monovalent hydrocarbon group having 1 to 10 carbon atoms; $R^9$ represents a divalent hydrocarbon group having 1 to 10 carbon atoms; n represents 0 or 1; k represents 0, 1, or 2; $R^{10}$ and $R^{11}$ may be the same or different and represent an alkyl or alkoxy group having 1 to 4 carbon atoms; Z represents a divalent organic group selected from any of

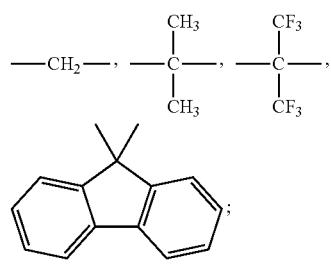

and X represents a divalent organic group shown by the following formula (3) or the following general formula (4),

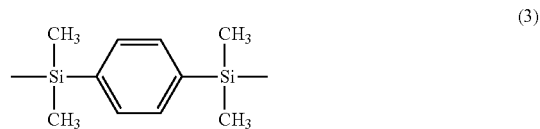

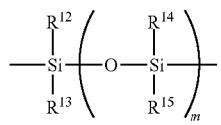

(4)

wherein $R^{12}$, $R^{13}$, $R^{14}$, and $R^{15}$ may be the same or different and represent a monovalent hydrocarbon group having 1 to 10 carbon atoms; and m represents a positive number of 1 to 100, (B) a photosensitive acid generator capable of generating an acid by decomposition with light having a wavelength of 190 to 500 nm, (C) a solvent, (D) one or two or more compounds selected from an amino condensate modified with formaldehyde or formaldehyde-alcohol, a phenol compound having on average two or more methylol groups or alkoxymethylol groups per molecule, and a polyhydric phenol compound whose phenolic hydroxyl group is substituted with a glycidoxy group, and (E) one or two or more compounds selected from polyhydric phenols having 3 or more hydroxyl groups.

The inventive semiconductor apparatus, which includes the first photosensitive insulating layer and the second photosensitive insulating layer composed of the photo-curable resin composition, is inhibited from warping.

The first photosensitive insulating layer can be formed by laminating the photo-curable resin layer of the photo-curable dry film. The second photosensitive insulating layer can be formed by laminating the photo-curable resin layer of the photo-curable dry film or applying the resist composition identical to the material of the photo-curable resin layer of the photo-curable dry film. In this manner, the periphery of the semiconductor device can be filled without voids even when the semiconductor device has a height of several tens of μm.

Furthermore, the present invention provides a stacked semiconductor apparatus that includes a plurality of the semiconductor apparatuses being stacked by flip chip.

Figure 2:
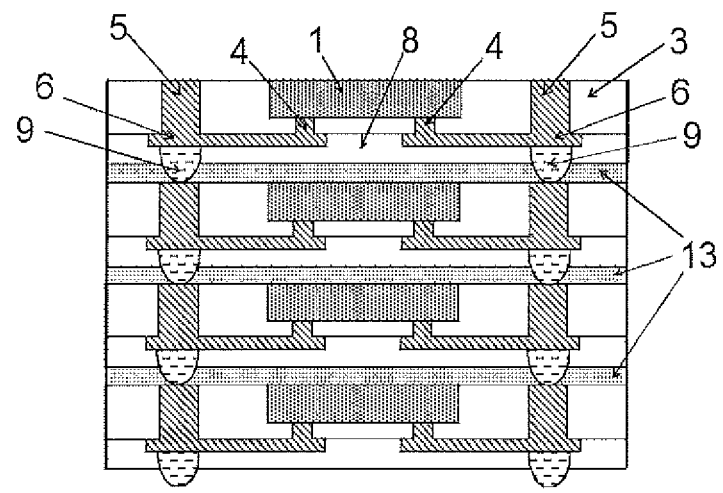
FIG. 2 is a cross-sectional view showing an example of the inventive stacked semiconductor apparatus.

The inventive stacked semiconductor apparatus includes, as shown in FIG. 2, multiple above-mentioned semiconductor apparatuses electrically connected through the through electrodes 5 and the solder bumps 9 and stacked by flip chip, and may further include insulating resin layers 13 inserted between the semiconductor apparatuses.

Furthermore, the present invention provides an encapsulated stacked-semiconductor apparatus that includes the stacked semiconductor apparatus placed on a substrate having an electric circuit and encapsulated with an insulating encapsulating resin layer.

Figure 3:
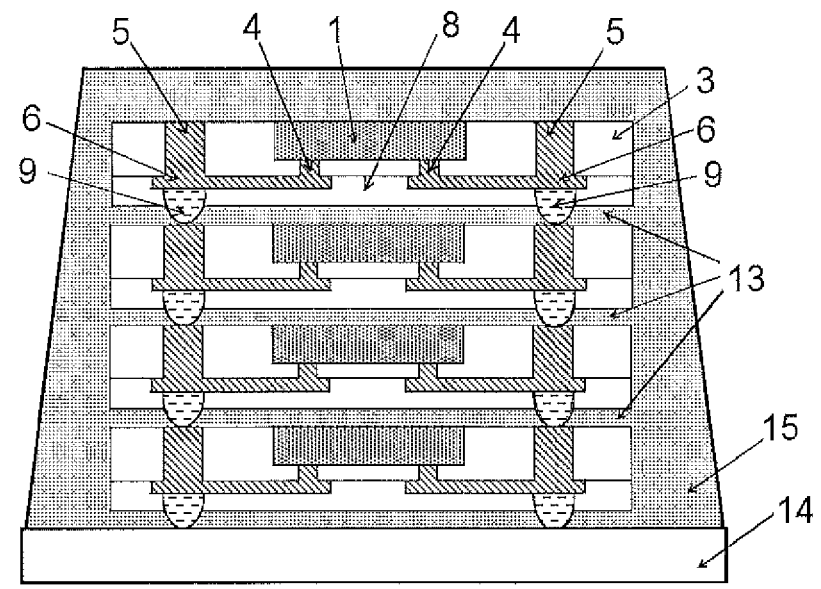
FIG. 3 is a cross-sectional view showing an example of the inventive encapsulated stacked-semiconductor apparatus.

The inventive encapsulated stacked-semiconductor apparatus includes, as shown in FIG. 3, the stacked semiconductor apparatus that is placed, through the solder bump 9, on a substrate (circuit board 14) having an electric circuit, and encapsulated with an insulating encapsulating resin layer 15.

Hereinafter, each component of the photo-curable resin composition used in the inventive semiconductor apparatus will be described.

[Component (A)]

The component (A) is a silicone polymer compound having an epoxy group-containing repeating unit shown by the following general formula (1) and a phenolic hydroxyl group-containing repeating unit shown by the following general formula (2). The silicone polymer compound has a weight average molecular weight of 3,000 to 500,000 and satisfies $0.05 \leq J/(J+K) \leq 0.95$ where J is a mole of epoxy groups in the general formula (1) and K is a mole of phenolic hydroxyl groups in the general formula (2),

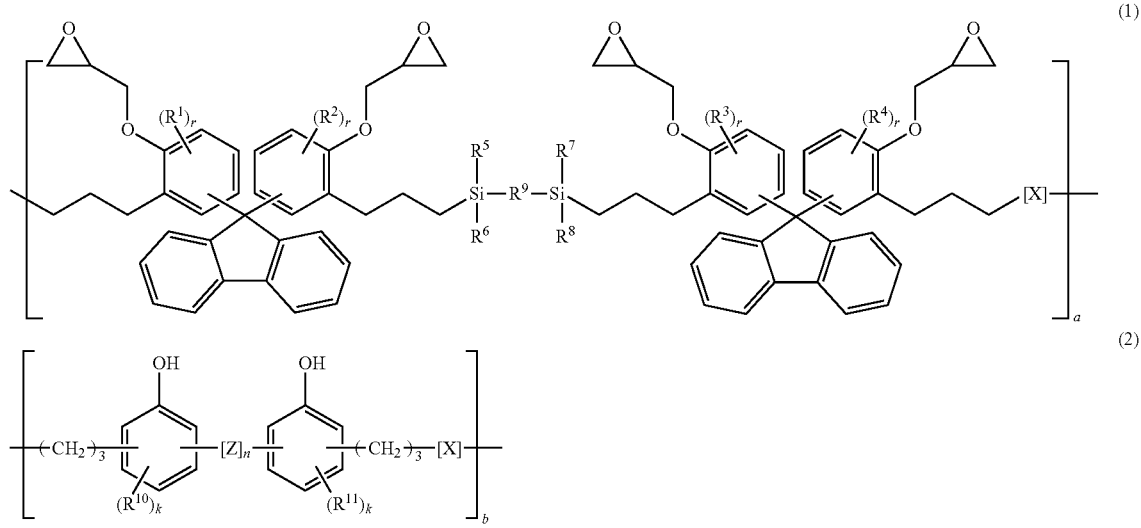

wherein a and b represent a positive number; $R^1$, $R^2$, $R^3$, and $R^4$ may be the same or different and represent a hydrogen atom or an alkyl or alkoxy group having 1 to 4 carbon atoms; r independently represents 0, 1, or 2; $R^5$ to $R^8$ independently represent a hydrogen atom or a monovalent hydrocarbon group having 1 to 10 carbon atoms; $R^9$ represents a divalent hydrocarbon group having 1 to 10 carbon atoms; n represents 0 or 1; k represents 0, 1, or 2; $R^{10}$ and $R^{11}$ may be the same or different and represent an alkyl or alkoxy group having 1 to 4 carbon atoms; Z represents a divalent organic group selected from any of

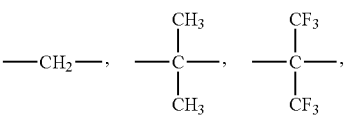

-continued

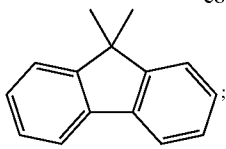

and X represents a divalent organic group shown by the following formula (3) or the following general formula (4),

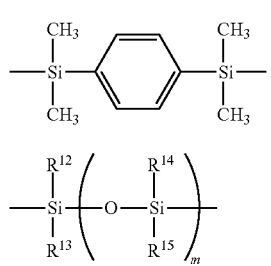

wherein $R^{12}$, $R^1$, $R^{14}$, and $R^{15}$ may be the same or different and represent a monovalent hydrocarbon group having 1 to 10 carbon atoms; and m represents a positive number of 1 to 100.

$R^1$ to $R^4$ in the general formula (1) each represent a hydrogen atom or an alkyl or alkoxy group having 1 to 4 carbon atoms. These may be the same or different from each other. Illustrative examples of the alkyl or alkoxy group having 1 to 4 carbon atoms include a methyl group, an ethyl group, an isopropyl group, a tert-butyl group, a methoxy group, an ethoxy group, and an isopropyloxy group.

$R^5$ to $R^8$ in the general formula (1) independently represent a hydrogen atom or a monovalent hydrocarbon group having 1 to 10 carbon atoms. Illustrative examples of the monovalent hydrocarbon group having 1 to 10 carbon atoms include linear, branched, or cyclic alkyl groups such as a methyl group, an ethyl group, a propyl group, an isopropyl group, a butyl group, an isobutyl group, an octyl group, and a cyclohexyl group; and aryl groups such as a phenyl group, a tolyl group, and a naphthyl group. Among them, a methyl group is preferable in view of availability of the raw material.

$R^9$ in the general formula (1) represents a divalent hydrocarbon group having 1 to 10 carbon atoms. Illustrative examples of $R^9$ include linear, branched, or cyclic alkylene groups such as a methylene group, an ethylene group, a propylene group, a butylene group, a pentylene group, a hexylene group, a cyclohexylene group, a heptylene group, an octylene group, a nonylene group, and a decylene group; and arylene groups such as a phenylene group, a tolylene group, and a naphthylene group. Among them, a phenylene group is preferable in view of availability of the raw material.

$R^{10}$ and $R^{11}$ in the general formula (2) each represent an alkyl or alkoxy group having 1 to 4 carbon atoms. These may be the same or different from each other. Illustrative examples of $R^{10}$ and $R^{11}$ include a methyl group, an ethyl group, an isopropyl group, a tert-butyl group, a methoxy group, an ethoxy group, and an isopropyloxy group.

$R^{12}$ to $R^{15}$ in the general formula (4) may be the same or different and represent a monovalent hydrocarbon group having 1 to 10 carbon atoms. $R^{12}$ to $R^{15}$ are preferably a monovalent hydrocarbon group having 1 to 8 carbon atoms, more preferably a monovalent hydrocarbon group having 1 to 6 carbon atoms. Illustrative examples of $R^{12}$ to $R^{15}$ include linear, branched, or cyclic alkyl groups such as a methyl group, an ethyl group, a propyl group, an isopropyl group, a n-butyl group, a tert-butyl group, an isobutyl group, an octyl group, and a cyclohexyl group; linear, branched, or cyclic alkenyl groups such as a vinyl group, an allyl group, a propenyl group, a butenyl group, a hexenyl group, and a cyclohexenyl group; aryl groups such as a phenyl group, a tolyl group, and a naphthyl group; and aralkyl groups such as a benzyl group and a phenethyl group. Among them, a methyl group is preferable in view of availability of the raw material.

m in the general formula (4) is a positive number of 1 to 100, preferably 1 to 80, in view of compatibility with later-described components (B), (D), and (E) and photocurability.

a in the general formula (1) and b in the general formula (2) are a positive number, preferably satisfying 0<a<1, 0<b<1, and a+b=1, more preferably 0.05≤a≤0.8 and 0.2≤b≤0.95, particularly preferably 0.2≤a≤0.8 and 0.2≤b≤0.8.

The ratio (mole ratio) between epoxy groups (J) in the general formula (1) and phenolic hydroxyl groups (K) in the general formula (2) satisfies 0.05≤J/(J+K)≤0.95, preferably 0.10≤J/(J+K)≤0.90, more preferably 0.10≤J/(J+K)≤0.85. Fewer epoxy groups (J) reduce adhesiveness to a substrate, while more epoxy groups (J) reduce pattern resolution.

The silicone polymer compound has a weight average molecular weight of 3,000 to 500,000, preferably 10,000 to 250,000. Such molecular weight is preferable in view of photo-curability of the photo-curable resin composition containing this silicone polymer compound and the dry film using the photo-curable resin composition for a photo-curable resin layer and mechanical characteristics of a cured film obtained by curing the photo-curable resin layer. Herein, the weight average molecular weight is determined by gel permeation chromatography (GPC) in terms of polystyrene (the same shall apply hereinafter).

Illustrative examples of the epoxy group-containing component shown by the general formula (1) are shown below.

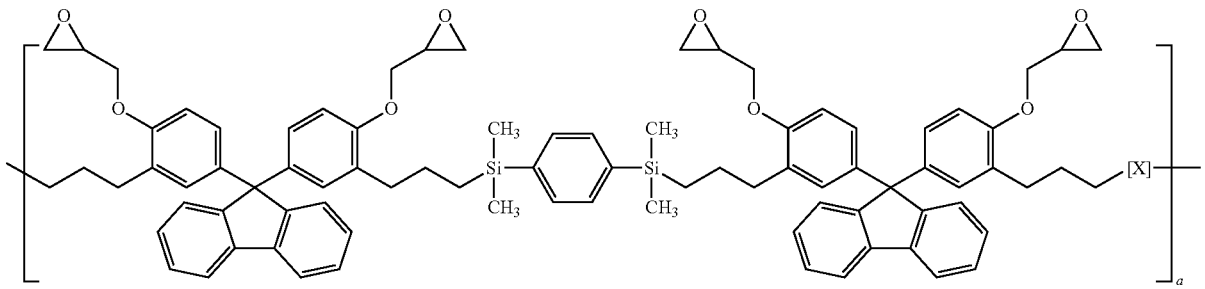

-continued

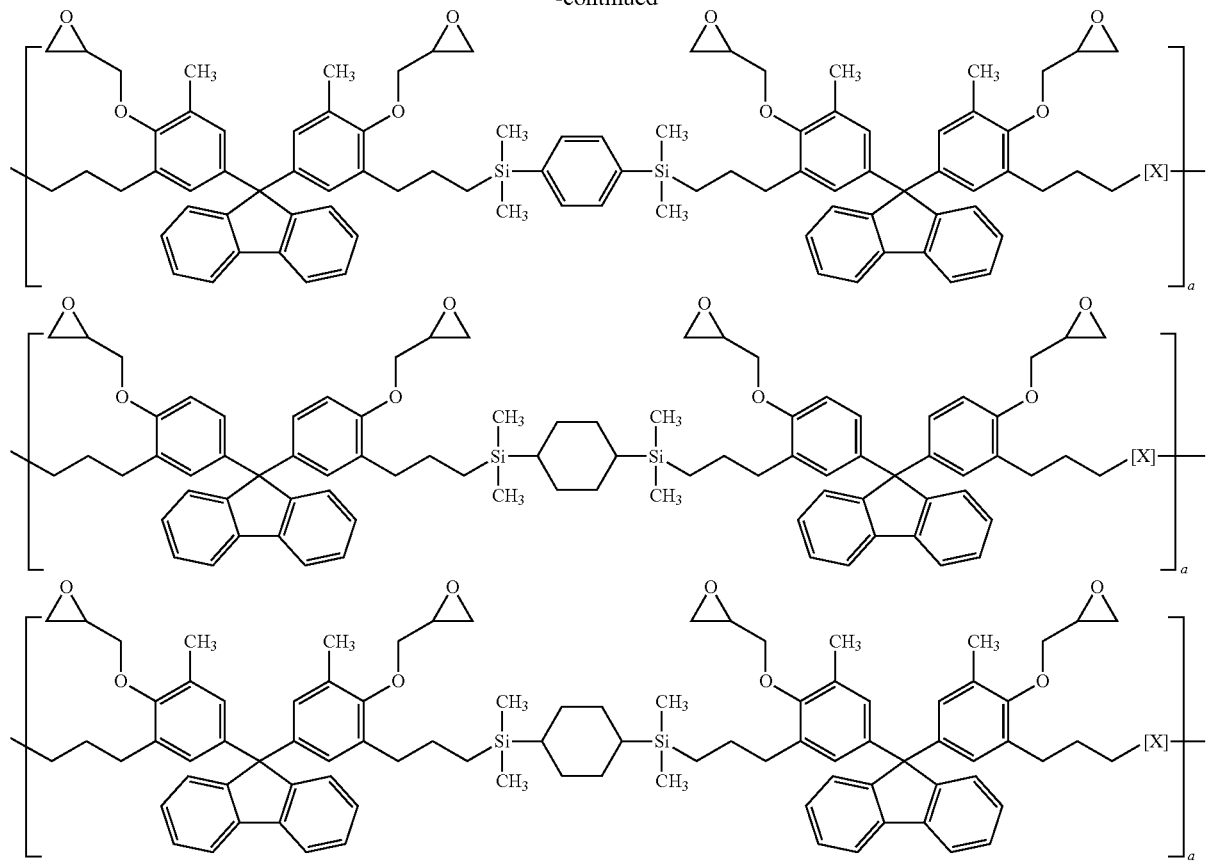

[Component (B)]

The component (B) is a photosensitive acid generator capable of generating an acid by decomposition with light having a wavelength of 190 to 500 nm. (B) The photosensitive acid generator may be a compound capable of generating an acid by exposure to light having a wavelength of 190 to 500 nm which serves as a curing catalyst. The component (A) has excellent compatibility with a photosensitive acid generator, so that various photosensitive acid generators can be used. Examples of the photosensitive acid generator include an onium salt, a diazomethane derivative, a glyoxime derivative, β-ketosulfone derivative, a disulfone derivative, a nitrobenzylsulfonate derivative, a sulfonate ester derivative, an imide-yl-sulfonate derivative, an oxime-sulfonate derivative, an iminosulfonate derivative, and a triazine derivative.

Examples of the onium salt include a compound shown by the general formula (5), $$(R^{16})_j M^+ K^-  \quad (5)$$

wherein $R^{16}$ represents an optionally substituted linear, branched, or cyclic alkyl group having 1 to 12 carbon atoms, an aryl group having 6 to 12 carbon atoms, or an aralkyl group having 7 to 12 carbon atoms; $M^+$ represents an iodonium ion or a sulfonium ion; $K^-$ represents a non-nucleophilic counter ion; and j is 2 or 3.

As to $R^{16}$, illustrative examples of the alkyl group include a methyl group, an ethyl group, a propyl group, a butyl group, a cyclohexyl group, a 2-oxocyclohexyl group, a norbornyl group, and an adamantyl group. Illustrative examples of the aryl group include a phenyl group; alkoxyphenyl groups such as an o-, m-, or p-methoxyphenyl group, an o-, m-, or p-ethoxyphenyl group, and a m- or p-tert-butoxyphenyl group; and alkylphenyl groups such as a 2-, 3-, or 4-methylphenyl group, a 2-, 3-, or 4-ethylphenyl group, a 4-tert-butylphenyl group, a 4-butylphenyl group, and a dimethylphenyl group. Illustrative examples of the aralkyl group include a benzyl group and a phenethyl group.

Illustrative examples of the non-nucleophilic counter ion $K^-$ include halide ions such as a chloride ion and a bromide ion; fluoroalkyl sulfonates such as triflate, 1,1,1-trifluoroethane sulfonate, and nonafluorobutane-sulfonate; aryl sulfonates such as tosylate, benzenesulfonate, 4-fluorobenzenesulfonate, and 1,2,3,4,5-pentafluorobenzenesulfonate; and alkyl sulfonates such as mesylate and butanesulfonate.

Examples of the diazomethane derivative include a compound shown by the general formula (6), $$R^{17}-O_2S-\underset{\underset{N_2}{\|}}{C}-SO_2-R^{17} \quad (6)$$

wherein $R^{17}$ may be the same or different and represents a linear, branched, or cyclic alkyl group or halogenated alkyl group having 1 to 12 carbon atoms, an aryl group or halogenated aryl group having 6 to 12 carbon atoms, or an aralkyl group having 7 to 12 carbon atoms.

As to $R^{17}$, illustrative examples of the alkyl group include a methyl group, an ethyl group, a propyl group, a butyl group, an amyl group, a cyclopentyl group, a cyclohexyl group, a norbornyl group, and an adamantyl group. Illustrative examples of the halogenated alkyl group include a trifluoromethyl group, a 1,1,1-trifluoroethyl group, a 1,1,1-trichloroethyl group, and a nonafluorobutyl group. Illustrative examples of the aryl group include a phenyl group; alkoxyphenyl groups such as an o-, m-, or p-methoxyphenyl group, an o-, m-, or p-ethoxyphenyl group, and a m- or p-tert-butoxyphenyl group; and alkylphenyl groups such as a 2-, 3-, or 4-methylphenyl group, a 2-, 3-, or 4-ethylphenyl group, a 4-tert-butylphenyl group, a 4-butylphenyl group, and a dimethylphenyl group. Illustrative examples of the halogenated aryl group include a fluorophenyl group, a chlorophenyl group, and a 1,2,3,4,5-pentafluorophenyl group. Illustrative examples of the aralkyl group include a benzyl group and a phenethyl group.

The photosensitive acid generator of component (B) used may be one kind alone or a combination of two or more kinds.

The formulation amount of the photosensitive acid generator of component (B) is preferably 0.05 to 20 parts by mass, particularly preferably 0.2 to 5 parts by mass, based on 100 parts by mass of the silicone polymer compound of component (A), in view of light absorption of the photosensitive acid generator itself and photo-curability of a thick film.

[Component (C)]

The component (C) is a solvent. As (C) the solvent, a solvent capable of dissolving the above-described components (A) and (B) and later-described components (D) and (E) may be selected.

Examples of (C) the solvent include ketones such as cyclohexanone, cyclopentanone, and methyl-2-n-amylketone; alcohols such as 3-methoxybutanol, 3-methyl-3-methoxybutanol, 1-methoxy-2-propanol, and 1-ethoxy-2-propanol; ethers such as propylene glycol monomethyl ether, ethylene glycol monomethyl ether, propylene glycol monoethyl ether, ethylene glycol monoethyl ether, propylene glycol dimethyl ether, and diethylene glycol dimethyl ether; and esters such as propylene glycol monomethyl ether acetate, propylene glycol monoethyl ether acetate, ethyl lactate, ethyl pyruvate, butyl acetate, methyl 3-methoxypropionate, ethyl 3-ethoxypropionate, tert-butyl acetate, tert-butyl propionate, propylene glycol mono-tert-butyl ether acetate, and γ-butyrolactone; these solvents may be used solely or in combination of two or more kinds. In particular, ethyl lactate, cyclohexanone, cyclopentanone, propylene glycol monomethyl ether acetate, and γ-butyrolactone, and a mixture thereof, which have the most excellent solubility to the photosensitive acid generator, are preferable.

The formulation amount of the component (C) is preferably 50 to 2,000 parts by mass, more preferably 50 to 1,000 parts by mass, based on 100 parts by mass of the total amount of the above-described components (A) and (B) and later-described components (D) and (E), in view of compatibility, viscosity, and coating properties of the photo-curable resin composition.

[Component (D)]

The component (D) is one or two or more compounds selected from an amino condensate modified with formaldehyde or formaldehyde-alcohol, a phenol compound having on average two or more methylol groups or alkoxymethylol groups per molecule, and a polyhydric phenol compound whose phenolic hydroxyl group is substituted with a glycidoxy group.

Examples of the amino condensate modified with formaldehyde or formaldehyde-alcohol include melamine condensates modified with formaldehyde or formaldehyde-alcohol and urea condensates modified with formaldehyde or formaldehyde-alcohol. The melamine condensate modified with formaldehyde or formaldehyde-alcohol can be synthesized by the following procedure, for example. First, a melamine monomer is modified with formalin into a methylol form, and optionally, the resultant compound is further modified with alcohol into an alkoxy form according to a known method, thereby obtaining a modified melamine shown by the general formula (7). The alcohol is preferably a lower alcohol, for example, an alcohol having 1 to 4 carbon atoms.

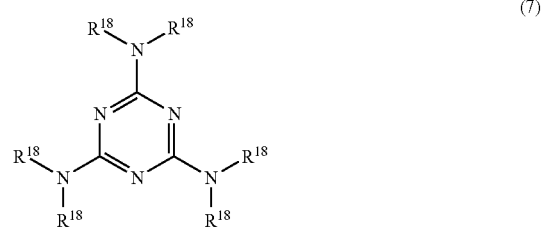

(7)

In the above formula, each $R^{18}$ may be the same or different and represents a methylol group, an alkoxymethyl group containing an alkoxy group having 1 to 4 carbon atoms, or a hydrogen atom, provided that at least one $R^{18}$ is a methylol group or an alkoxymethyl group.

Examples of $R^{18}$ include a methylol group, alkoxymethyl groups such as a methoxymethyl group and an ethoxymethyl group, and a hydrogen atom.

Illustrative examples of the modified melamine shown by the general formula (7) include trimethoxymethyl monomethylol melamine, dimethoxymethyl monomethylol melamine, trimethylol melamine, hexamethylol melamine, and hexamethoxymethylol melamine.

Then, the modified melamine shown by the general formula (7) or the multimeric compound thereof (e.g. oligomer including dimer and trimer) is polymerized by addition condensation with formaldehyde until a desired molecular weight is achieved according to a known method, thereby obtaining the melamine condensate modified with formaldehyde or formaldehyde-alcohol.

The urea condensate modified with formaldehyde or formaldehyde-alcohol can be synthesized by modifying a urea condensate having a desired molecular weight with formaldehyde into a methylol form, and optionally, further modifying the resultant compound with alcohol into an alkoxy form, according to a known method.

Examples of the urea condensate modified with formaldehyde or formaldehyde-alcohol include a methoxymethylated urea condensate, an ethoxymethylated urea condensate, and a propoxymethylated urea condensate. These urea condensates modified with formaldehyde or formaldehyde-alcohol may be used solely or in combination of two or more kinds.

Examples of the phenol compound having on average two or more methylol groups or alkoxymethylol groups per molecule include (2-hydroxy-5-methyl)-1,3-benzenedimethanol, 2,2',6,6'-tetramethoxymethyl bisphenol A. These phenol compounds may be used solely or in combination of two or more kinds.

Examples of the polyhydric phenol compound whose phenolic hydroxyl group is substituted with a glycidoxy group include 1,1'-diglycidoxy bisphenol A, tris(4-glycidoxyphenyl)methane, and 1,1,1-tris(4-glycidoxyphenyl)ethane, which are obtained by reacting, in the presence of a base, hydroxyl groups of bisphenol A, tris(4-hydroxyphenyl)methane, or 1,1,1-tris(4-hydroxyphenyl)ethane with epichlorohydrin. These polyhydric phenol compounds whose phenolic hydroxyl group is substituted with a glycidoxy group may be used solely or in combination of two or more kinds.

The component (D) used may be one kind alone or a combination of two or more kinds.

[Component (E)]

The component (E) is one or two or more compounds selected from polyhydric phenols having 3 or more hydroxyl groups. Examples of the component (E) include alkylphenols such as phenol, bisphenol A, p-tert-butylphenol, octylphenol, and p-cumylphenol, a resol-type phenol resin synthesized by using p-phenylphenol and cresol as raw materials, and a novolak-type phenol resin. Other examples include tris(4-hydroxyphenyl)methane and 1,1,1-tris(4-hydroxyphenyl)ethane.

The component (E) used may be one kind alone or a combination of two or more kinds.

The components (D) and (E) can serve as crosslinking agents.

The total amount of the components (D) and (E) is preferably 0.5 to 50 parts by mass, more preferably 1 to 30 parts by mass, based on 100 parts by mass of the silicone polymer compound of component (A), in view of photo-curability and reliability as a post-cured top coat to protect electric and electronic parts. Such a formulation amount prevents problems of the connection between patterns and the decrease in resolution.

[Component (F)]

The photo-curable resin composition used in the inventive semiconductor apparatus may further contain a basic compound as component (F), if necessary. The basic compound is preferably a compound capable of reducing diffusion rate of an acid generated from the photosensitive acid generator into a resist film. Blending the basic compound enhances resolution, reduces the change of sensitivity after exposure, decreases dependence on a substrate and an environment, and thus improves exposure margin, pattern profile, and the like.

Examples of the basic compound include primary, secondary, and tertiary aliphatic amines, mixed amines, aromatic amines, heterocyclic amines, nitrogen-containing compounds having a carboxyl group, nitrogen-containing compounds having a sulfonyl group, nitrogen-containing compounds having a hydroxyl group, nitrogen-containing compounds having a hydroxyphenyl group, nitrogen-containing alcoholic compounds, amide derivatives, imide derivatives, and compounds shown by the following general formula (8), $$N(\alpha)_q(\beta)_{3-q} \tag{8}$$

wherein q represents 1, 2, or 3; the side chain α may be the same or different and represents a substituent shown by any of the general formulae (9) to (11); the side chain β may be the same or different and represents a hydrogen atom or a linear, branched, or cyclic alkyl group having 1 to 20 carbon atoms and optionally containing an ether bond or a hydroxyl group; and the side chains a may be bonded with each other to form a ring.

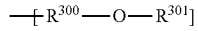  (9)

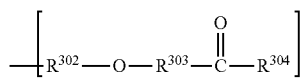  (10)

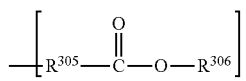  (11)

In the above formula, $R^{300}$, $R^{302}$, and $R^{305}$ represent a linear or branched alkylene group having 1 to 4 carbon atoms; $R^{301}$ and $R^{304}$ represent a hydrogen atom, or a linear, branched, or cyclic alkyl group having 1 to 20 carbon atoms and optionally containing one or more groups selected from a hydroxyl group, an ether bond, an ester bond, and a lactone ring; $R^{303}$ represents a single bond, or a linear or branched alkylene group having 1 to 4 carbon atoms; and $R^{306}$ represents a linear, branched, or cyclic alkyl group having 1 to 20 carbon atoms and optionally containing one or more groups selected from a hydroxyl group, an ether bond, an ester bond, and a lactone ring.

Illustrative examples of the compound shown by the general formula (8) include tris[2-(methoxymethoxy)ethyl] amine, tris[2-(2-methoxyethoxy)ethyl] amine, tris[2-(2-methoxyethoxymethoxy)ethyl] amine, tris[2-(1-methoxyethoxy)ethyl] amine, tris[2-(1-ethoxyethoxy) ethyl]amine, tris[2-(1-ethoxypropoxy) ethyl] amine, tris[2-{2-(2-hydroxyethoxy)ethoxy}ethyl] amine, 4,7,13,16,21,24-hexaoxa-1,10-diazabicyclo[8.8.8]hexacosane, 4,7,13,18-tetraoxa-1,10-diazabicyclo[8.5.5]eicosane, 1,4,10,13-tetraoxa-7,16-diazabicyclooctadecane, 1-aza-12-crown-4, 1-aza-15-crown-5, 1-aza-18-crown-6, tris(2-formyloxyethyl) amine, tris(2-acetoxyethyl) amine, tris(2-propionyloxyethyl) amine, tris(2-butyryloxyethyl) amine, tris(2-isobutyryloxyethyl) amine, tris(2-valeryloxyethyl) amine, tris(2-pivaloyloxyethyl) amine, N,N-bis(2-acetoxyethyl) 2-(acetoxyacetoxy)ethyl amine, tris(2-methoxycarbonyloxyethyl) amine, tris(2-tert-butoxycarbonyloxyethyl) amine, tris[2-(2-oxopropoxy)ethyl]amine, tris[2-(methoxycarbonylmethyl)oxyethyl] amine, tris[2-(tert-butoxycarbonylmethyloxy)ethyl] amine, tris[2-(cyclohexyloxycarbonylmethyloxy)ethyl] amine, tris(2-methoxycarbonylethyl) amine, tris(2-ethoxycarbonylethyl) amine, N,N-bis(2-hydroxyethyl) 2-(methoxycarbonyl)ethyl amine, N,N-bis(2-acetoxyethyl) 2-(methoxycarbonyl)ethyl amine, N,N-bis(2-hydroxyethyl) 2-(ethoxycarbonyl)ethyl amine, N,N-bis(2-acetoxyethyl) 2-(ethoxycarbonyl)ethyl amine, N,N-bis(2-hydroxyethyl) 2-(2-methoxyethoxycarbonyl)ethyl amine, N,N-bis(2-acetoxyethyl) 2-(2-methoxyethoxycarbonyl)ethyl amine, N,N-bis(2-hydroxyethyl) 2-(2-hydroxyethoxycarbonyl)ethyl amine, N,N-bis(2-acetoxyethyl) 2-(2-acetoxyethoxycarbonyl)ethyl amine, N,N-bis(2-hydroxyethyl) 2-[(methoxycarbonyl)methoxycarbonyl]ethyl amine, N,N-bis(2-acetoxyethyl) 2-[(methoxycarbonyl)methoxycarbonyl]ethyl amine, N,N-bis(2-hydroxyethyl) 2-(2-oxopropoxycarbonyl)ethyl amine, N,N-bis(2-acetoxyethyl) 2-(2-oxopropoxycarbonyl) ethyl amine, N,N-bis(2-hydroxyethyl) 2-(tetrahydrofurfuryloxycarbonyl)ethyl amine, N,N-bis(2-acetoxyethyl) 2-(tetrahydrofurfuryloxycarbonyl)ethyl amine, N,N-bis(2-hydroxyethyl) 2-[(2-oxotetrahydrofuran-3-yl)oxycarbonyl] ethyl amine, N,N-bis(2-acetoxyethyl) 2-[(2-oxotetrahydrofuran-3-yl)oxycarbonyl]ethyl amine, N,N-bis(2-hydroxyethyl) 2-(4-hydroxybutoxycarbonyl)ethyl amine, N,N-bis(2-formyloxyethyl) 2-(4-formyloxybutoxycarbonyl) ethyl amine, N,N-bis(2-formyloxyethyl) 2-(2-formyloxyethoxycarbonyl)ethyl amine, N,N-bis(2-methoxyethyl) 2-(methoxycarbonyl)ethyl amine, N-(2-hydroxyethyl) bis [2-(methoxycarbonyl)ethyl] amine, N-(2-acetoxyethyl) bis [2-(methoxycarbonyl)ethyl] amine, N-(2-hydroxyethyl) bis

[2-(ethoxycarbonyl)ethyl] amine, N-(2-acetoxyethyl) bis[2-(ethoxycarbonyl)ethyl] amine, N-(3-hydroxy-1-propyl) bis[2-(methoxycarbonyl)ethyl] amine, N-(3-acetoxy-1-propyl) bis[2-(methoxycarbonyl)ethyl] amine, N-(2-methoxyethyl) bis[2-(methoxycarbonyl)ethyl] amine, N-butyl bis[2-(methoxycarbonyl)ethyl] amine, N-butyl bis[2-(2-methoxyethoxycarbonyl)ethyl] amine, N-methyl bis(2-acetoxyethyl) amine, N-ethyl bis(2-acetoxyethyl) amine, N-methyl bis(2-pivaloyloxyethyl) amine, N-ethyl bis[2-(methoxycarbonyloxy)ethyl] amine, N-ethyl bis[2-(tert-butoxycarbonyloxy) ethyl] amine, tris(methoxycarbonylmethyl) amine, tris(ethoxycarbonylmethyl) amine, N-butyl bis(methoxycarbonylmethyl) amine, N-hexyl bis(methoxycarbonylmethyl) amine, and 1-(diethylamino)-8-valerolactone, although the compound is not limited thereto.

The basic compound of component (F) used may be one kind alone or a combination of two or more kinds.

The formulation amount of the basic compound of component (F) is preferably 0 to 3 parts by mass, particularly preferably 0.01 to 1 part by mass, based on 100 parts by mass of the silicone polymer compound of component (A), in view of sensitivity. Such a formulation amount prevents decrease in resolution and deterioration of a pattern.

[Component (G)]

The photo-curable resin composition used in the inventive semiconductor apparatus may further contain (G) a curing accelerator. (G) The curing accelerator is a compound that serves to accelerate the curing rate when a compound having an epoxy group is cured. Examples thereof include tertiary amines, salts thereof, and imidazole derivatives.

The curing accelerator may be a commercially available product, and illustrative examples thereof include 2MZ-A, 2MZ-OK, 2PHZ, 2P4BHZ, and 2P4MHZ-PW (all products are imidazole compounds) available from Shikoku Chemicals Corporation, and U-CAT3503N, U-CAT3502T (both products are block isocyanate compounds of dimethylamine), DBU, DBN, U-CATSA102, and U-CAT5002 (all products are bycyclic amidine compounds and salts thereof) available from San-Apro Ltd.

The formulation amount of the curing accelerator of component (G) is preferably 0 to 3 parts by mass, particularly preferably 0 to 1 part by mass, based on 100 parts by mass of the silicone polymer compound of component (A), in view of sensitivity. Such a formulation amount prevents decrease in resolution and deterioration of a pattern. When the component (G) is contained, the amount thereof is preferably 0.05 parts by mass or more based on 100 parts by mass of the silicone polymer compound of component (A).

A cured product of the photo-curable resin composition in the present invention preferably has an elastic modulus of 0.1 to 2 GPa and a tensile strength of 1 to 80 MPa. In addition, a cured product of the photo-curable resin composition in the present invention preferably has a linear expansion coefficient of 180 ppm/° C. or less, more preferably 10 to 150 ppm/° C. The semiconductor apparatus including the first photosensitive insulating layer and the second photosensitive insulating layer composed of such a photo-curable resin composition is more excellent in durability.

A method for preparing the photo-curable resin composition is not particularly limited. For example, the photo-curable resin composition can be prepared by mixing and stirring the above-described components and filtering the mixture through a filter or the like.

Such a photo-curable resin composition facilitates fine patterning of a thick film and patterning with high sensitivity even on an uneven substrate, and can form a film excellent in various film characteristics, particularly, adhesiveness to a substrate used for a circuit board, reliability as electric and electronic parts, and reliability as a material for bonding substrates.

The inventive method for manufacturing a semiconductor apparatus will be now described.

The semiconductor apparatus as described above can be manufactured by the inventive method for manufacturing a semiconductor apparatus shown below. The inventive method for manufacturing a semiconductor apparatus includes the steps of:

(1) preparing a photo-curable dry film including a photo-curable resin layer sandwiched between a supporting film and a protective film, the photo-curable resin layer having a thickness of 10 to 300 µm and being composed of a resist composition;

(2) forming a first photosensitive insulating layer by laminating the photo-curable resin layer of the photo-curable dry film on a substrate including a semiconductor device adhering or temporarily adhering to an upper surface of the substrate such that the semiconductor device is covered with the photo-curable resin layer, the semiconductor device having a height of 20 to 100 µm and including an exposed electrode pad;

(3) patterning the first photosensitive insulating layer by lithography through a mask to simultaneously form an opening on the electrode pad and an opening for forming a through electrode provided outside the semiconductor device;

(4) after patterning, baking a pattern obtained by the patterning of the first photosensitive insulating layer to cure the pattern;

(5) after curing, forming a seed layer by sputtering and then filling the opening on the electrode pad and the opening for forming a through electrode by plating to form an on-semiconductor-device metal pad and a through electrode respectively, and connecting the on-semiconductor-device metal pad and the through electrode formed by plating through a metal interconnect formed by plating;

(6) after forming the metal interconnect, forming a second photosensitive insulating layer by laminating the photo-curable resin layer of the photo-curable dry film or applying the resist composition, and patterning the second photosensitive insulating layer to form an opening on the through electrode;

(7) after patterning, baking a pattern obtained by the patterning of the second photosensitive insulating layer to cure the pattern; and (8) after curing, forming a solder bump in the opening on the through electrode. The photo-curable dry film prepared in the step (1) includes the photo-curable resin layer composed of the chemically amplified negative resist composition containing the components (A) to (E) and, if necessary, the optional components (F) and (G).

Hereinafter, each step will be described in detail.

In the step (1), a photo-curable dry film is first prepared. The photo-curable dry film used in the inventive method for manufacturing a semiconductor apparatus includes a photo-curable resin layer sandwiched between a supporting film and a protective film. The photo-curable resin layer has a thickness of 10 to 300 µm and is composed of the chemically amplified negative resist composition containing the components (A) to (E) and, if necessary, the optional components (F) and (G).

In the photo-curable dry film used in the inventive method for manufacturing a semiconductor apparatus, the resist composition constituting the photo-curable resin layer can be prepared by stirring and mixing the components (A) to (E) and, if necessary, the optional components (F) and (G) and then filtering the mixture through a filter or the like.

The supporting film of the photo-curable dry film used in the inventive method for manufacturing a semiconductor apparatus may be a monolayer or a multilayer film having multiple polymer films being laminated. The material thereof may be a synthetic resin film such as polyethylene, polypropylene, polycarbonate, and polyethylene terephthalate. Among them, polyethylene terephthalate, which has appropriate flexibility, mechanical strength, and heat resistance, is preferable. These films may be subjected to various treatments such as corona treatment and coating treatment with a releasing agent. The film may be a commercially available product, and illustrative examples thereof include Cerapeel WZ (RX), Cerapeel BX8 (R) (both are available from Toray Advanced Film Co., Ltd.), E7302, E7304 (both are available from Toyobo Co., Ltd.), Purex G31, Purex G71T1 (both are available from Teijin DuPont Films Japan Ltd.), PET38×1-A3, PET38×1-V8, and PET38×1-X08 (all available from Nippa Co., Ltd.).

The protective film of the photo-curable dry film used in the inventive method for manufacturing a semiconductor apparatus may be the same film as the supporting film mentioned above, but polyethylene terephthalate and polyethylene, which have appropriate flexibility, are preferable. The film may be a commercially available product, and illustrative examples thereof include, besides the polyethylene terephthalates already exemplified, polyethylene such as GF-8 (available from Tamapoly Co., Ltd.) and PE Film 0-Type (available from Nippa Co., Ltd.).

The thicknesses of the supporting film and the protective film are preferably 10 to 200 µm each, in view of stable production of the photo-curable dry film and the rolling habit around a roll axis, so-called curl-prevention.

A method for manufacturing the photo-curable dry film used in the inventive method for manufacturing a semiconductor apparatus will be now described. As to an apparatus for manufacturing the photo-curable dry film, a film coater for producing an adhesive product may be generally used. Illustrative examples of the film coater include a comma coater, a comma reverse coater, a multi coater, a die coater, a lip coater, a lip reverse coater, a direct gravure coater, an offset gravure coater, a 3-roll bottom reverse coater, and a 4-roll bottom reverse coater.

The dry film can be manufactured as follows. A supporting film is rolled-out from a roll-out axis of a film coater, and the resist composition is applied onto the supporting film with a prescribed thickness to form a photo-curable resin layer while the film passes through a coater head of the film coater. This film then passes through a hot-air circulating oven at a prescribed temperature for a prescribed period. The supporting film with the photo-curable resin layer thus dried thereon passes through a laminate roll together with a protective film rolled-out from another roll-out axis of the film coater under a prescribed pressure to bond the protective film to the photo-curable resin layer on the supporting film and then is rolled-up by a roll-up axis of the film coater. In this operation, the temperature of the hot-air circulating oven preferably ranges from 25 to 150° C., the period for passing through preferably ranges from 1 to 100 minutes, and the laminate roll pressure preferably ranges from 0.01 to 5 MPa.

The photo-curable resin layer of the photo-curable dry film used in the inventive method for manufacturing a semiconductor apparatus has a thickness of 10 to 300 µm, preferably 10 to 250 µm. When a first photosensitive insulating layer is formed by using the photo-curable dry film, the photo-curable resin layer has a thickness of preferably 100 to 300 µm, more preferably 100 to 250 µm. When a second photosensitive insulating layer is formed by using the photo-curable dry film, the photo-curable resin layer has a thickness of preferably 10 to 200 µm, more preferably 10 to 100 µm. When a second photosensitive insulating layer is formed by applying the resist composition, it is preferable to apply the resist composition such that the second photosensitive insulating layer has a thickness of preferably 10 to 200 µm, more preferably 10 to 100 µm.

The photo-curable dry film can be manufactured by the above-mentioned method. When such a photo-curable dry film is used, warpage can be reduced, and a semiconductor apparatus in which the periphery of the semiconductor device is filled without voids can be manufactured even when the semiconductor device has a height of several tens of µm.

Then, in the step (2), a first photosensitive insulating layer is formed by laminating the photo-curable resin layer of the photo-curable dry film on a substrate including a semiconductor device adhering or temporarily adhering to an upper surface of the substrate such that the semiconductor device is covered with the photo-curable resin layer. The semiconductor device used therein has a height of 20 to 100 µm and includes an exposed electrode pad.

Figure 4:
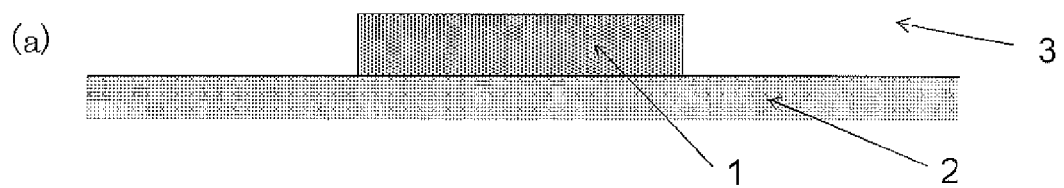
FIG. 4 is a cross-sectional view showing the step (2) in an example of the inventive method for manufacturing a semiconductor apparatus.

First, the protective film is delaminated from the photo-curable dry film. As shown in FIG. 4 (a), the photo-curable resin layer of the photo-curable dry film is then laminated on the substrate 2, to which the semiconductor device 1 has been adhered or temporarily adhered, to form the first photosensitive insulating layer 3. In the case that the product will be diced into individual pieces without removing the substrate 2 from the semiconductor device 1 in the later step, interconnect may be formed on the substrate 2, and the semiconductor device 1 is fixed to the substrate 2 with an adhesive. In the case that the substrate 2 will be removed after the multilayer redistribution step, the semiconductor device 1 is fixed to the substrate 2 with a temporary adhesive.

An apparatus for bonding the photo-curable dry film to the substrate, to which the semiconductor device has been adhered or temporarily adhered, is preferably a vacuum laminator. The photo-curable dry film is attached to the film-bonding apparatus, the protective film is delaminated from the photo-curable dry film, and the photo-curable resin layer thereby exposed is bonded to the substrate on a table at a prescribed temperature by an adhering roll under a prescribed pressure in a vacuum chamber with a prescribed degree of vacuum. The temperature of the table is preferably 60 to 120° C. The pressure of the adhering roll is preferably 0 to 5.0 MPa. The degree of vacuum of the vacuum chamber is preferably 50 to 500 Pa. Such vacuum lamination prevents voids from generating on the periphery of the semiconductor device, and thus is preferable.

To obtain a photo-curable resin layer with a required thickness, the films may be bonded multiple times, as needed. For example, about 1 to 10 times bonding can provide a resin layer with a thickness of about 10 to 1000 µm, particularly 100 to 500 µm.

In addition, when the first photosensitive insulating layer 3 is formed on the semiconductor device 1, the first photosensitive insulating layer 3 on the semiconductor device 1 can be thick, or the portion farther from the semiconductor device 1 can be thinner, as shown in FIG. 4 (b). Thus, the method preferably includes mechanically pressing the film to flatten this variation in thickness and thin the film on the semiconductor device, as shown in FIG. 4 (a).

Figure 5:
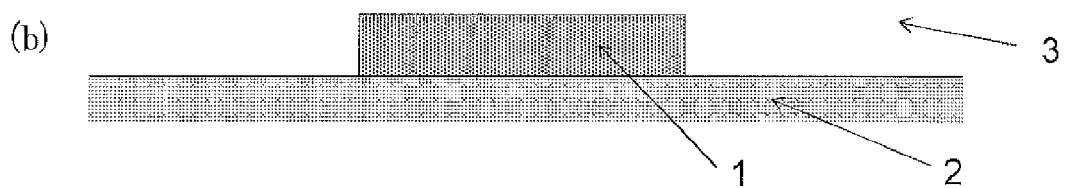
FIG. 5 is a cross-sectional view showing the steps (3) and (4) in an example of the inventive method for manufacturing a semiconductor apparatus.

Then, in the step (3), the first photosensitive insulating layer is patterned by lithography through a mask to simultaneously form an opening a on the electrode pad and an opening b for forming a through electrode provided outside the semiconductor device 1, as shown in FIG. 5.

In this patterning, after the first photosensitive insulating layer is formed, the layer is exposed to light, subjected to post exposure baking (PEB), developed, and optionally post-cured to form a pattern. In other words, a known lithography technique can be used for patterning.

To effectively carry out photo-curing reaction of the first photosensitive insulating layer, to improve adhesion between the first photosensitive insulating layer 3 and the substrate 2, or to improve planarity of the adhering first photosensitive insulating layer, pre-baking may be performed, if necessary. The pre-baking may be performed, for example, at 40 to 140° C. for 1 minute to 1 hour.

The layer is exposed to light having a wavelength of 190 to 500 nm via a photomask with the supporting film remaining or being removed, and then cured. The photomask may be obtained by engraving a prescribed pattern. The photomask is preferably made of a material that can shield the light having a wavelength of 190 to 500 nm. For example, materials such as chromium are preferably used, but it is not limited thereto.

Examples of the light having a wavelength of 190 to 500 nm include lights having various wavelengths generated from, for example, a radiation-generating apparatus, including UV light such as g-beam and i-beam and far ultraviolet light (248 nm and 193 nm). The wavelength preferably ranges from 248 to 436 nm. The exposure dose preferably ranges from 10 to 3,000 mJ/cm$^2$. Such exposure causes the exposed part to crosslink, thereby forming a pattern that is insoluble in a developer described later.

Further, PEB is performed to enhance the development sensitivity. The PEB is preferably performed at 40 to 140° C. for 0.5 to 10 minutes.

The layer is then developed with a developer. Preferable examples of the developer include organic solvents such as isopropyl alcohol (IPA) and propylene glycol monomethyl ether acetate (PGMEA). Preferable examples of an alkali aqueous solution used for the developer include a 2.38% tetramethyl ammonium hydroxide (TMAH) aqueous solution. In the inventive method for manufacturing a semiconductor apparatus, an organic solvent is preferably used as the developer.

The development can be carried out by a usual method, for example, by soaking the substrate having a formed pattern into a developer. Then, if necessary, washing, rinsing, drying, and so forth may be performed to obtain a film of the first photosensitive insulating layer having an intended pattern.

Then, in the step (4), the pattern obtained by the patterning of the first photosensitive insulating layer is baked to cure the pattern.

The pattern obtained by the patterning of the first photosensitive insulating layer is baked with an oven or a hot plate preferably at 100 to 250° C., more preferably 150 to 220° C., much more preferably 170 to 190° C. to cure the pattern (post-curing). When the post-curing temperature ranges from 100 to 250° C., the crosslinking density of the film of the first photosensitive insulating layer is increased, and remaining volatile components can be removed. Thus, this temperature range is preferable in view of adhesiveness to a substrate, heat resistance, strength, and electronic characteristics. The time for post-curing can range from 10 minutes to 10 hours.

Moreover, in the patterning of the first photosensitive insulating layer, it is rational and preferable to simultaneously form the opening a on the electrode pad exposed on the semiconductor device 1 and the opening b for forming a through electrode (TMV) provided outside the semiconductor device 1 by one-shot exposure.

Then, in the step (5), the opening on the electrode pad and the opening for forming a through electrode, which have been formed by patterning, is filled by plating to form an on-semiconductor-device metal pad and a through electrode, respectively. The on-semiconductor-device metal pad and the through electrode thus formed by plating are further connected through a metal interconnect formed by plating.

Figure 6:
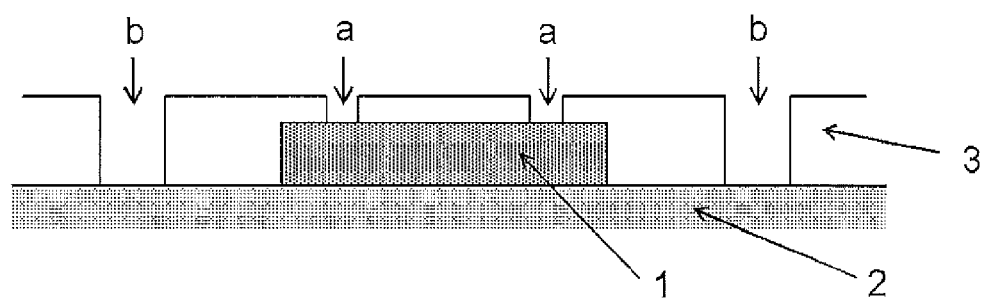
FIG. 6 is a cross-sectional view showing the step (5) in an example of the inventive method for manufacturing a semiconductor apparatus.

The plating is performed as follows, for example. A seed layer is formed by sputtering, and the plated resist is then patterned. The opening a on the electrode pad and the opening b for forming a through electrode are then filled by plating, such as electrolytic plating, to form the on-semiconductor-device metal pad 4, the through electrode 5, and the metal interconnect 6 connecting to the on-semiconductor-device metal pad 4 and the through electrode 5, as shown in FIG. 6.

Figure 7:
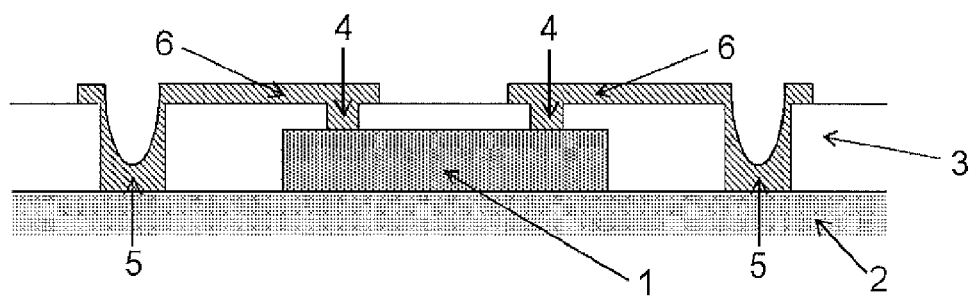
FIG. 7 is a cross-sectional view showing the step (5) in an example of the inventive method for manufacturing a semiconductor apparatus.

In this step, the through electrode 5 may be further plated by additional electrolytic plating to add plating of the through electrode 5 and fill the through electrode 5 with a metal plating 7, as shown in FIG. 7.

Figure 8:
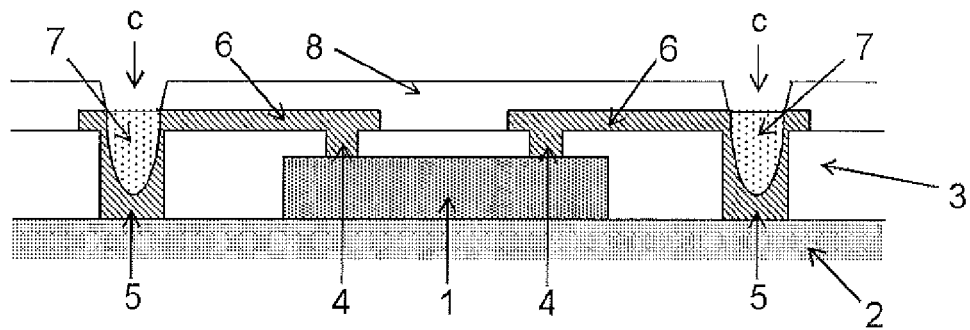
FIG. 8 is a cross-sectional view showing the steps (6) and (7) in an example of the inventive method for manufacturing a semiconductor apparatus.

Then, in the step (6), a second photosensitive insulating layer 8 is formed by laminating the photo-curable resin layer of the photo-curable dry film again or applying a solution of the resist composition directly with a spin coater or the like, and then patterned to form an opening c on the through electrode, as shown in FIG. 8. This patterning may be performed in the same manner as in the step (3).

Even in the case that the resist composition is applied, the second photosensitive insulating layer can be formed with the same thickness as in the case using the photo-curable dry film. The application may be performed by a method employed in a known lithography technique. For example, the application may be performed by a method such as dipping, spin coating, and roll coating. Among them, spin coating is preferable.

Then, in the step (7), the pattern obtained by the patterning of the second photosensitive insulating layer is baked to cure the pattern. This baking may be performed in the same manner as in the step (4).

Then, in the step (8), a solder bump is formed in the opening c on the through electrode.

Figure 9:
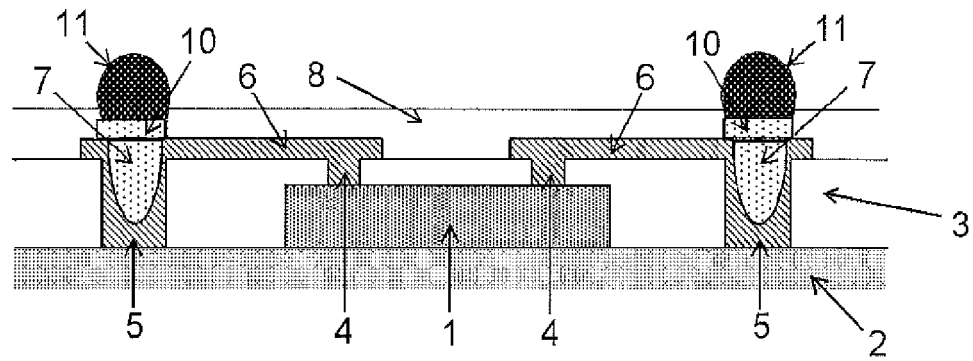
FIG. 9 is a cross-sectional view showing the step (8) in an example of the inventive method for manufacturing a semiconductor apparatus.

The solder bump may be formed by, for example, plating the opening c on the through electrode to form an on-through-electrode metal pad 10, and then forming a solder ball 11 on the on-through-electrode metal pad 10 as the solder bump, as shown in FIG. 9.

Figure 10:
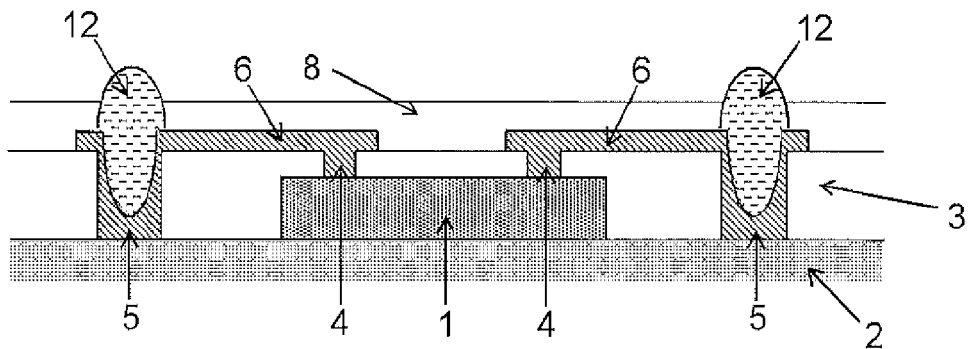
FIG. 10 is a cross-sectional view showing the step (8) in another example of the inventive method for manufacturing a semiconductor apparatus.

Alternatively, the solder bump may be formed as follows. In the step (5), the through electrode 5 is further plated with SnAg to add plating, as shown in FIG. 7. In the subsequent step (6), the second photosensitive insulating layer is formed as mentioned above and then patterned to form the opening on the through electrode such that the SnAg plating is uncovered. After the step (7) of curing by baking, in the step (8), the SnAg plating is melted and brought to protrude toward the opening c on the through electrode to form a protruding SnAg electrode 12 as the solder bump, as shown in FIG. 10.

Figure 11:
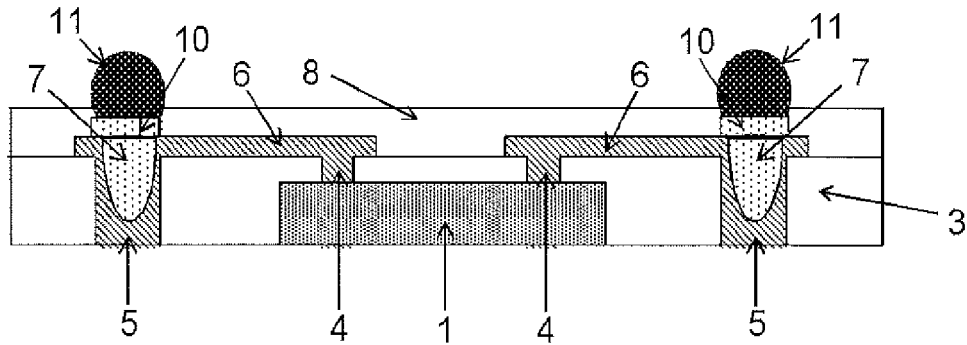
FIG. 11 is a cross-sectional view showing an example of the individual semiconductor apparatus obtained by the inventive method for manufacturing a semiconductor apparatus.

After the step (8), if the semiconductor device 1 has temporarily adhered to the substrate 2 in the step (2), the substrate 2 may be removed to uncover the opposite side of the solder ball 11 of the through electrode 5 provided outside the semiconductor device 1, and the uncovered seed layer may be removed by etching to expose the metal plating portion, as shown in FIG. 11. This allows the upper portion and the lower portion of the through electrode 5 to electrically continue. Thereafter, the semiconductor apparatus may be diced into individual pieces, whereby individual semiconductor apparatus 20 can be obtained.

Figure 12:
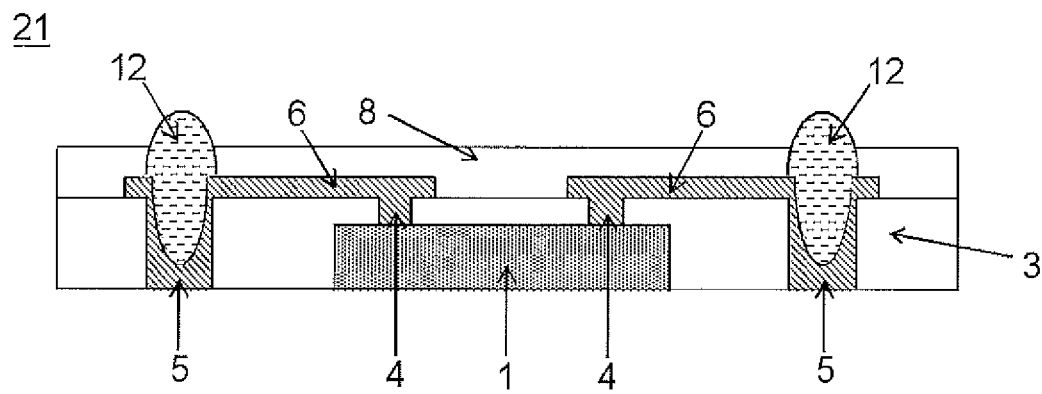
FIG. 12 is a cross-sectional view showing another example of the individual semiconductor apparatus obtained by the inventive method for manufacturing a semiconductor apparatus.

In the case that the protruding SnAg electrode 12 is formed as the solder bump, the substrate 2 may be removed to uncover the opposite side of the protruding SnAg electrode 12 of the through electrode 5 provided outside the semiconductor device 1, and the uncovered seed layer may be removed by etching to expose the metal plating portion, as shown in FIG. 12. This allows the upper portion and the lower portion of the through electrode 5 to electrically continue. Thereafter, the semiconductor apparatus may be diced into individual pieces, whereby individual semiconductor apparatus 21 can be obtained.

Figure 13:
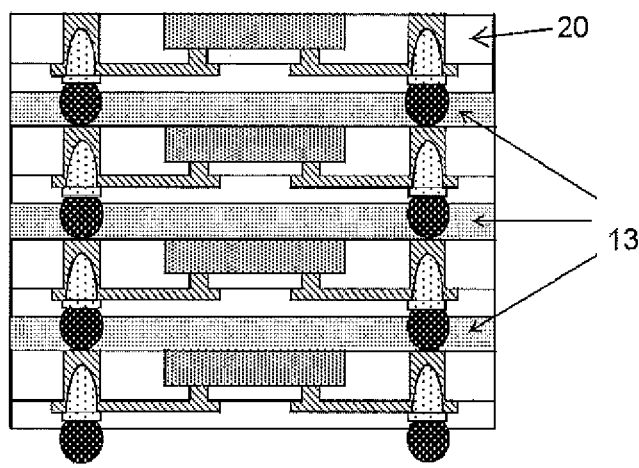
FIG. 13 is a cross-sectional view showing an example of the inventive method for manufacturing a stacked semiconductor apparatus.
Figure 14:
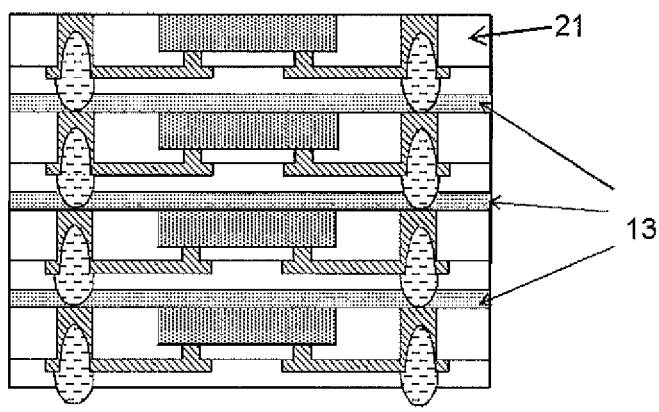
FIG. 14 is a cross-sectional view showing another example of the inventive method for manufacturing a stacked semiconductor apparatus.
Figure 15:
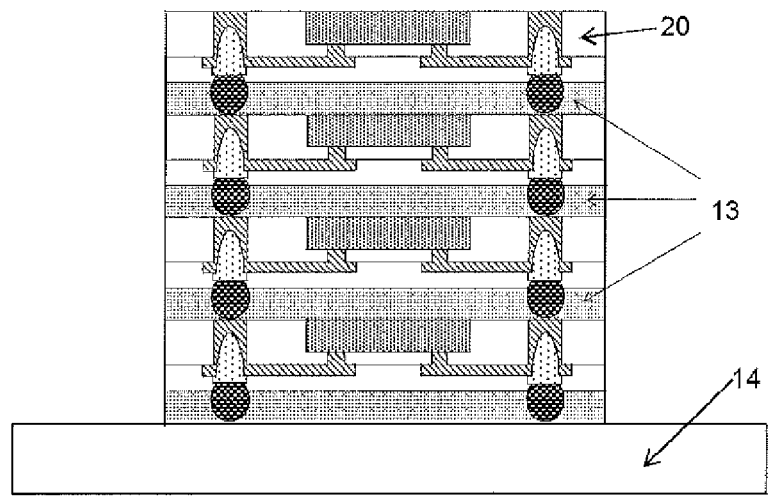
FIG. 15 is a cross-sectional view showing an example of the inventive stacked semiconductor apparatus placed on a circuit board.
Figure 16:
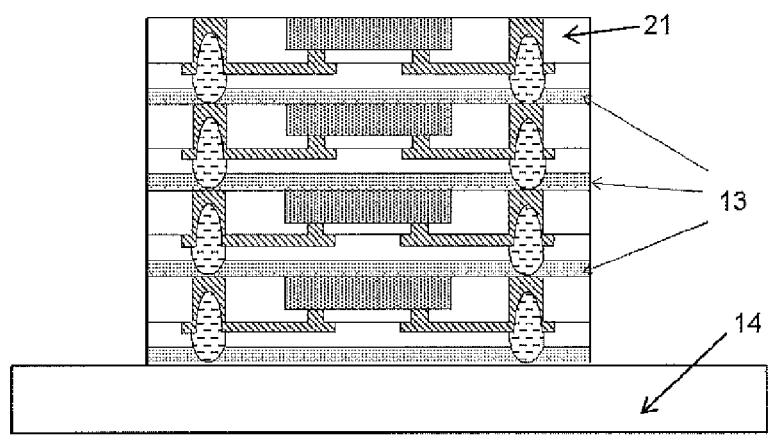
FIG. 16 is a cross-sectional view showing another example of the inventive stacked semiconductor apparatus placed on a circuit board.

The individual semiconductor apparatuses 20 or the individual semiconductor apparatuses 21 can be stacked while inserting insulting resin layers 13 such that the individual semiconductor apparatuses are electrically connected through the solder bump to obtain a stacked semiconductor apparatus, as shown in FIG. 13 and FIG. 14. The stacked semiconductor apparatus can be placed on a substrate (circuit board 14) having an electric circuit, as shown in FIG. 15 and FIG. 16. FIGS. 13, 14, 15, and 16 each show an example in which the semiconductor apparatuses 20 or 21 are flip-chip bonded.

Figure 17:
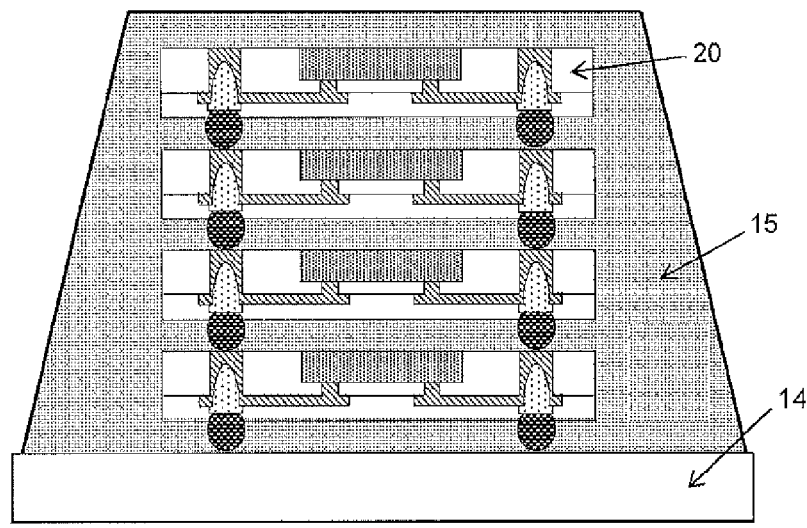
FIG. 17 is a cross-sectional view showing an example of the inventive method for manufacturing an encapsulated stacked-semiconductor apparatus.
Figure 18:
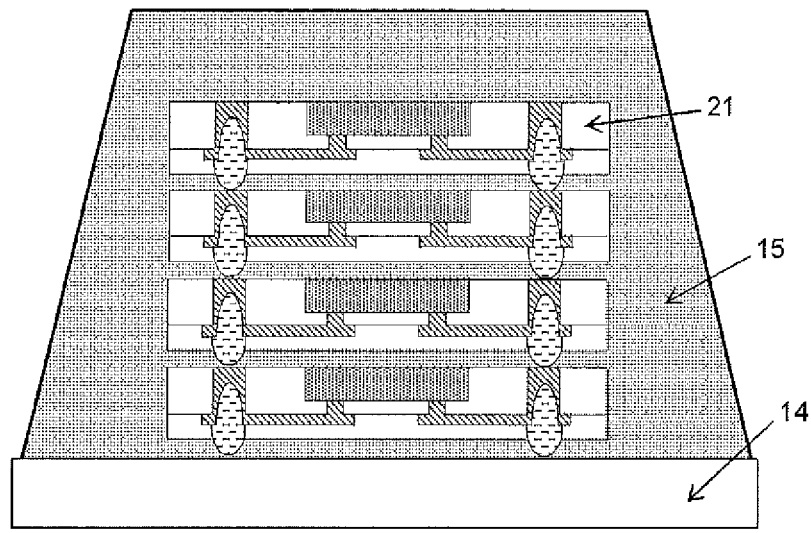
FIG. 18 is a cross-sectional view showing another example of the inventive method for manufacturing an encapsulated stacked-semiconductor apparatus.
Figure 19:
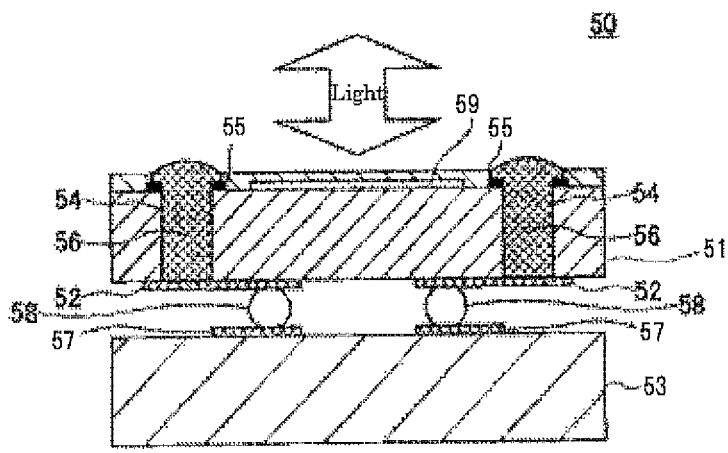
FIG. 19 is an explanatory view showing a conventional method for manufacturing a semiconductor apparatus.
Figure 20:
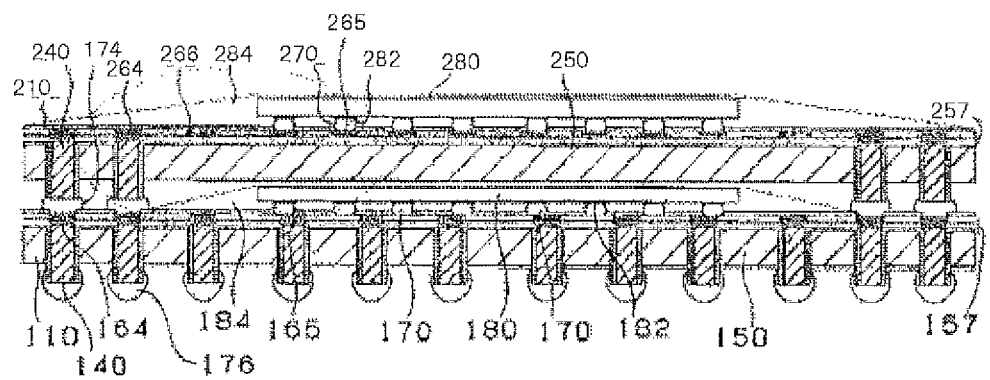
FIG. 20 is an explanatory view showing a conventional method for manufacturing a semiconductor apparatus.
Figure 21:
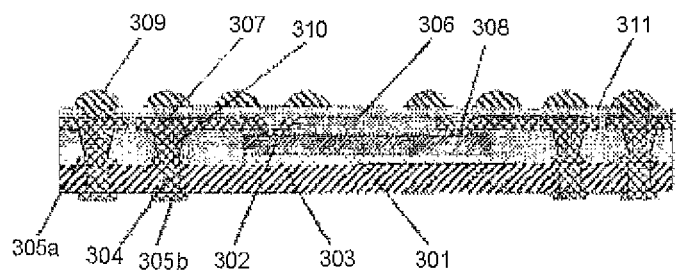
FIG. 21 is an explanatory view showing a conventional method for manufacturing a semiconductor apparatus.
Figure 22:
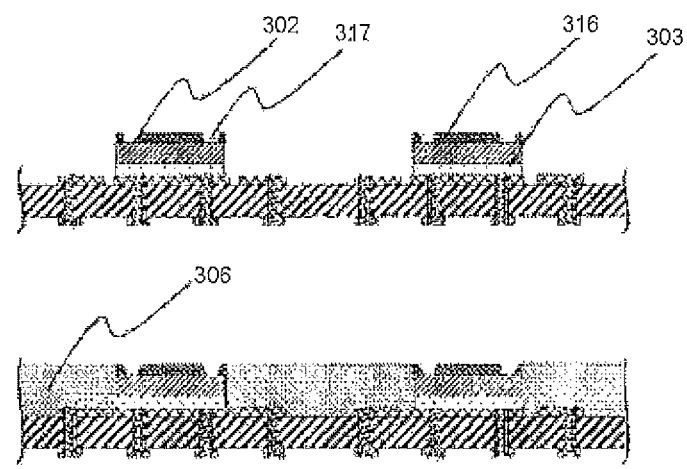
FIG. 22 is an explanatory view showing a conventional method for manufacturing a semiconductor apparatus.

In addition, the stacked semiconductor apparatus thus manufactured can be placed on a circuit board 14 and encapsulated with an insulating encapsulating resin layer 15 to manufacture an encapsulated stacked-semiconductor apparatus, as shown in FIG. 17 and FIG. 18.

A resin used in the insulting resin layer 13 or the insulating encapsulating resin layer 15 may be any materials commonly used for this use. Examples thereof include epoxy resins, silicone resins, and hybrid resins thereof.

The inventive semiconductor apparatus, stacked semiconductor apparatus, and encapsulated stacked-semiconductor apparatus manufactured as described above can be suitably used for fan-out wiring formed in a semiconductor chip and wafer level chip size package (WCSP).

As described above, the inventive method for manufacturing a semiconductor apparatus facilitates placing on a circuit board and stacking the semiconductor apparatuses by forming a fine electrode on the semiconductor device and providing the through electrode outside the semiconductor device. This method also facilitates processing the through electrode, the openings of the electrode pad portion and the like. In addition, when the photo-curable dry film including the photo-curable resin layer composed of the chemically amplified negative resist composition containing the components (A) to (E) and, if necessary, the optional components (F) and (G) is used, warpage can be reduced, and a semiconductor apparatus in which the periphery of the semiconductor device is filled without voids can be manufactured even when the semiconductor device has a height of several tens of μm.

Moreover, the inventive semiconductor apparatus thus obtained can be easily placed on a circuit board and stacked, and thus can be used for a stacked semiconductor apparatus including the semiconductor apparatuses being stacked and for an encapsulated stacked-semiconductor apparatus including the stacked semiconductor apparatus placed on a circuit board and then encapsulated.

EXAMPLES

Hereinafter, the present invention will be specifically described with reference to examples and comparative examples, but the present invention is not limited to the following examples. The structural formulae of compounds (M-1) to (M-5) used in synthesis examples of the present invention are shown below.

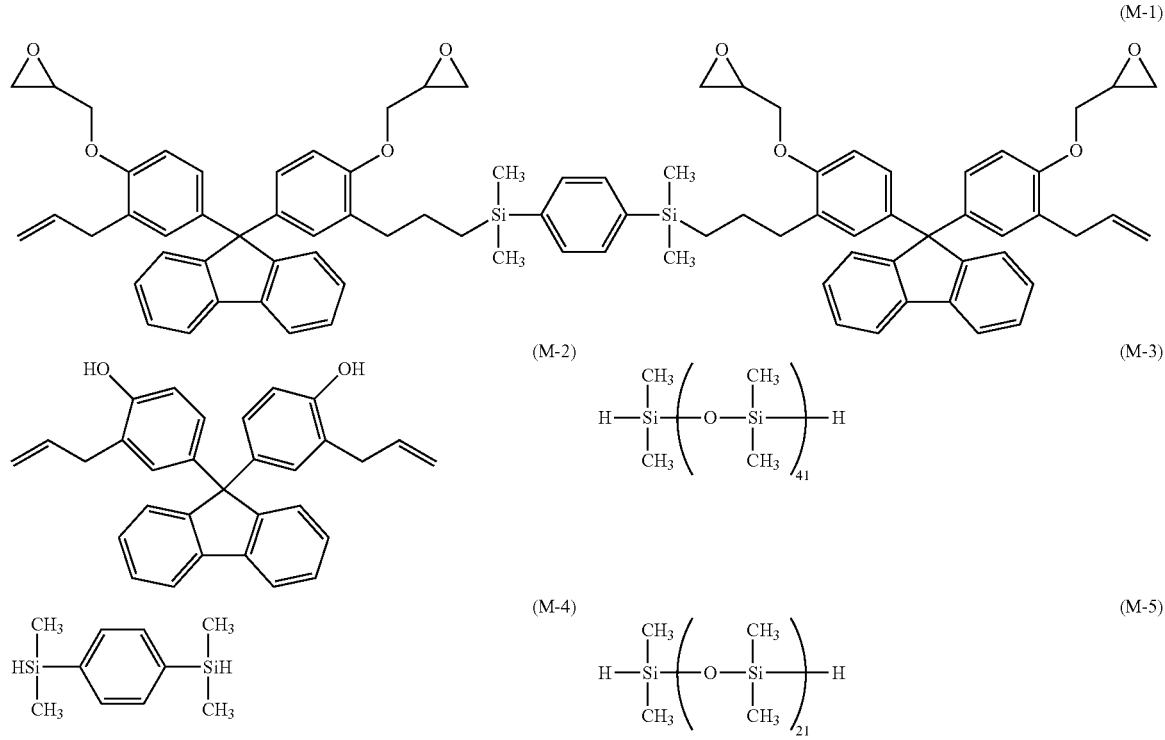

Synthesis Example 1

A 1 L separable flask equipped with a nitrogen gas introducing tube, a thermometer, a Dimroth condenser, and a dropping funnel was charged with 215 g (0.5 mol) of an unsaturated group-containing compound shown by the formula (M-2), 500 g of toluene, and 0.10 g of a carbon carried platinum catalyst (5 mass %). Then, 48.5 g (0.25 mol) of 1,4-bis(dimethylsilyl)benzene shown by the formula (M-4) was gradually added dropwise thereto at 75° C. This dropwise addition took 10 minutes. After completion of dropwise addition, the mixture was aged at 75° C. for 10 hours. After completion of aging, gas chromatography analysis was performed and showed that the amount of the 1,4-bis(dimethylsilyl)benzene was reduced to 2% or less. This solution was then concentrated with a rotary evaporator at 80° C. under a reduced pressure of 0.6 kPa to obtain 250 g of a brown solid. The obtained brown solid was analyzed by infrared absorption spectrometry and $^1$H nuclear magnetic resonance spectrometry, resulting in a silphenylene compound having fluorene structures with an allyl group and phenolic hydroxyl groups at both terminals, as shown below.

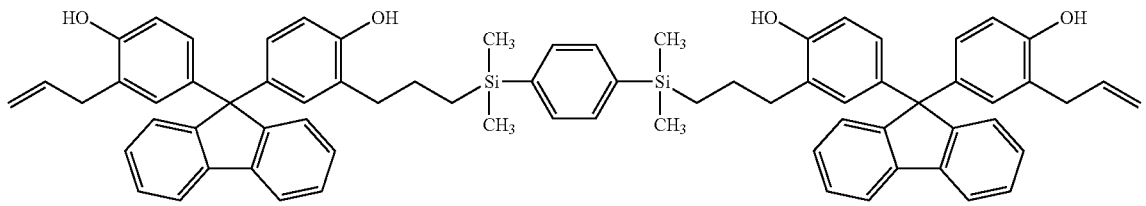 [SMILES: C=CCc1cc(C2(c3ccc(O)c(CCC[Si](C)(C)c4ccc([Si](C)(C)CCCc5cc(C6(c7ccc(O)c(CC=C)c7)c7ccccc7-c7ccccc76)ccc5O)cc4)c3)c3ccccc3-c3ccccc32)ccc1O]

Subsequently, a 1 L separable flask equipped with a nitrogen gas introducing tube, a thermometer, a Dimroth condenser, and a dropping funnel was charged with 210.8 g (0.2 mol) of the resulting silphenylene compound having fluorene structures with an allyl group and phenolic hydroxyl groups at both terminals. This compound was dissolved in 278 g (3.0 mol) of epichlorohydrin, mixed with 0.44 g of tetramethylammonium chloride, and stirred at 100° C. for 5 hours. Then, 44 g of a 40% sodium hydroxide aqueous solution was added dropwise thereto over 3 hours at 70° C. under reduced pressure (20 kPa). During dropwise addition, produced water was removed from the system by azeotropic distillation with the epichlorohydrin, and the evaporated epichlorohydrin was restored to the system. After completion of dropwise addition, the reaction was further continued for 30 minutes. Thereafter, the formed salt was removed by filtration, the solution was washed with water, and the epichlorohydrin was distilled off to obtain 180 g of a brown solid. The obtained brown solid was analyzed by infrared absorption spectrometry and $^1$H nuclear magnetic resonance spectrometry, resulting in a silphenylene-skeleton-containing compound (M-1) having fluorene structures with an allyl group and epoxy groups at both terminals.

Synthesis Example 2

A 5 L flask equipped with a stirrer, thermometer, nitrogen purge system, and reflux condenser was charged with 256.0 g of compound (M-1) and 53.8 g of compound (M-2). These compounds were dissolved in 1300 g of toluene and heated at 60° C. Thereafter, 1.6 g of carbon carried platinum catalyst (5 mass %) was added thereto, and a mixture of 53.5 g of compound (M-4) and 151.0 g of compound (M-3) was added dropwise to the flask over 1 hour. At this time, the temperature inside the flask increased to 78° C. After completion of dropwise addition, the solution was aged at 90° C. for 5 hours and then cooled to room temperature. Then, 1000 g of methyl isobutyl ketone was added thereto, and the reaction solution was filtered through a filter under pressure to remove the platinum catalyst. Further, 500 g of pure water was added to the obtained polymer compound solution, and the solution was stirred, allowed to stand, and separated into layers to remove the lower aqueous layer. This liquid separation and water-washing operation was repeated 6 times to remove trace amounts of acid components in the polymer compound solution. The solvent in the polymer compound solution was then distilled off under reduced pressure, and 330 g of cyclopentanone was added to obtain a silicone polymer compound solution (A-1) containing the cyclopentanone as the main solvent with a solid concentration of 60 mass %. The molecular weight of the silicone polymer compound in this solution was measured by GPC, consequently finding a weight average molecular weight of 45,000 in terms of polystyrene. Calculation of the mole ratio of the raw materials showed that this silicone polymer compound corresponds to the component (A) in which a in the general formula (1) is 0.616 and b in the general formula (2) is 0.384. In addition, the ratio between epoxy groups (J) in the general formula (1) and phenolic hydroxyl groups (K) in the general formula (2) was J/(J+K)=0.762.

Synthesis Example 3

A 5 L flask equipped with a stirrer, thermometer, nitrogen purge system, and reflux condenser was charged with 170.6 g of compound (M-1) and 35.9 g of compound (M-2). These compounds were dissolved in 1300 g of toluene and heated at 60° C. Thereafter, 1.6 g of carbon carried platinum catalyst (5 mass %) was added thereto, and a mixture of 6.5 g of compound (M-4) and 296.0 g of compound (M-5) was added dropwise to the flask over 1 hour. At this time, the temperature inside the flask increased to 75° C. After completion of dropwise addition, the solution was aged at 90° C. for 3 hours and then cooled to room temperature. Then, 1000 g of methyl isobutyl ketone was added thereto, and the reaction solution was filtered through a filter under pressure to remove the platinum catalyst. Further, 500 g of pure water was added to the obtained polymer compound solution, and the solution was stirred, allowed to stand, and separated into layers to remove the lower aqueous layer. This liquid separation and water-washing operation was repeated 6 times to remove trace amounts of acid components in the polymer compound solution. The solvent in the polymer compound solution was then distilled off under reduced pressure, and 320 g of cyclopentanone was added to obtain a silicone polymer compound solution (A-2) containing the cyclopentanone as the main solvent with a solid concentration of 60 mass %. The molecular weight of the silicone polymer compound in this solution was measured by GPC, consequently finding a weight average molecular weight of 32,000 in terms of polystyrene. Calculation of the mole ratio of the raw materials showed that this silicone polymer compound corresponds to the component (A) in which a in the general formula (1) is 0.615 and b in the general formula (2) is 0.385. In addition, the ratio between epoxy groups (J) in the general formula (1) and phenolic hydroxyl groups (K) in the general formula (2) was J/(J+K)=0.762.

Synthesis Example 4

A 5 L flask equipped with a stirrer, thermometer, nitrogen purge system, and reflux condenser was charged with 93.3 g of compound (M-1) and 26.9 g of compound (M-2). These compounds were dissolved in 1300 g of toluene and heated at 60° C. Thereafter, 1.6 g of carbon carried platinum catalyst (5 mass %) was added thereto, and 409.0 g of compound (M-3) was added dropwise to the flask over 1 hour. At this time, the temperature inside the flask increased to 76° C. After completion of dropwise addition, the solution was aged at 90° C. for 3 hours and then cooled to room temperature. Then, 1000 g of methyl isobutyl ketone was added thereto, and the reaction solution was filtered through a filter under pressure to remove the platinum catalyst. Further, 500 g of pure water was added to the obtained polymer compound solution, and the solution was stirred, allowed to stand, and separated into layers to remove the lower aqueous layer. This liquid separation and water-washing operation was repeated 6 times to remove trace amounts of acid components in the polymer compound solution. The solvent in the polymer compound solution was then distilled off under reduced pressure, and 320 g of cyclopentanone was added to obtain a silicone polymer compound solution (A-3) containing the cyclopentanone as the main solvent with a solid concentration of 60 mass %. The molecular weight of the silicone polymer compound in this solution was measured by GPC, consequently finding a weight average molecular weight of 250,000 in terms of polystyrene. Calculation of the mole ratio of the raw materials showed that this silicone polymer compound corresponds to the component (A) in which a in the general formula (1) is 0.538 and b in the general formula (2) is 0.462. In addition, the ratio between epoxy groups (J) in the general formula (1) and phenolic hydroxyl groups (K) in the general formula (2) was J/(J+K)=0.700.

Synthesis Example 5

A 5 L flask equipped with a stirrer, thermometer, nitrogen purge system, and reflux condenser was charged with 441.0 g of compound (M-2). The compound was dissolved in 1875 g of toluene, mixed with 949.6 g of compound (M-3) and heated at 60° C. Thereafter, 2.2 g of carbon carried platinum catalyst (5 mass %) was added thereto, and after confirming that the internal reaction temperature was increased to 65 to 67° C., the mixture was further heated to 90° C., kept for 3 hours, and then cooled to 60° C. Then, 2.2 g of carbon carried platinum catalyst (5 mass %) was added again, and 107.3 g of compound (M-4) was added dropwise to the flask over 1 hour. At this time, the temperature inside the flask increased to 78° C. After completion of dropwise addition, the solution was aged at 90° C. for 5 hours and then cooled to room temperature. Then, 1700 g of methyl isobutyl ketone was added thereto, and the reaction solution was filtered through a filter under pressure to remove the platinum catalyst. Further, 760 g of pure water was added to the obtained polymer compound solution, and the solution was stirred, allowed to stand, and separated into layers to remove the lower aqueous layer. This liquid separation and water-washing operation was repeated 6 times to remove trace amounts of acid components in the polymer compound solution. The solvent in the polymer compound solution was then distilled off under reduced pressure, and 950 g of cyclopentanone was added to obtain a silicone polymer compound solution (B-1) containing the cyclopentanone as the main solvent with a solid concentration of 60 mass %. The molecular weight of the silicone polymer compound in this solution was measured by GPC, consequently finding a weight average molecular weight of 51,000 in terms of polystyrene. The polymer compound in the silicone polymer compound solution (B-1) obtained in Synthesis Example 5 contains no epoxy group-containing repeating unit shown by the general formula (1) of the silicon polymer compound of component (A).

Examples and Comparative Examples

According to the formulation amount shown in Table 1, the silicone polymer compound solution (component (A)), a photosensitive acid generator (component (B)), crosslinking agents (components (D) and (E)), a basic compound (component (F)), a solvent (component (C)), and other additives were mixed, stirred, and dissolved at room temperature. The solution was filtered through a 1.0 μm filter made of Teflon (registered trade mark) for microfiltration to obtain photo-curable resin compositions of Examples 1 to 4 and Comparative Examples 1 and 2.

TABLE 1

| | Components of photo-curable resin composition | | | | | | | Elastic modulus at 25° C. (GPa) | Tensile strength (MPa) | Linear expansion coefficient (ppm/° C.) |
|---|---|---|---|---|---|---|---|---|---|---|
| | Silicone polymer compound | Photosensitive acid generator | Crosslinking agent | Crosslinking agent | Basic compound | Additive | Solvent | | | |
| Example 1 | A-1 100 parts | PAG-1 2 parts | XL-1 10 parts | PH-1 5 parts | | U-CAT 5002 0.01 part | cyclopentanone 55 parts | 0.6 | 25 | 150 |
| Example 2 | A-1 100 parts | PAG-2 2 parts | XL-1 10 parts | PH-1 5 parts | | | cyclopentanone 55 parts | 0.5 | 30 | 120 |
| Example 3 | A-2 100 parts | PAG-1 2 parts | XL-1 10 parts | PH-1 5 parts | AM-1 0.1 part | | cyclopentanone 55 parts | 0.7 | 20 | 115 |
| Example 4 | A-3 100 parts | PAG-1 2 parts | XL-1 10 parts | PH-1 5 parts | | | cyclopentanone 55 parts | 0.5 | 20 | 135 |
| Comparative Example 1 | B-1 100 parts | PAG-2 2 parts | XL-1 10 parts | | AM-1 0.1 part | | cyclopentanone 55 parts | 0.2 | 15 | 250 |

TABLE 1-continued

| | Components of photo-curable resin composition | | | | | | | Elastic modulus at 25° C. (GPa) | Tensile strength (MPa) | Linear expansion coefficient (ppm/° C.) |
|---|---|---|---|---|---|---|---|---|---|---|
| | Silicone polymer compound | Photosensitive acid generator | Crosslinking agent | Crosslinking agent | Basic compound | Additive | Solvent | | | |
| Comparative Example 2 | B-1 100 parts | PAG-3 2 parts | XL-1 10 parts | EP-1 5 parts | | | cyclopentanone 55 parts | 0.3 | 15 | 200 |

The photosensitive acid generators shown in Table 1 are as follows.

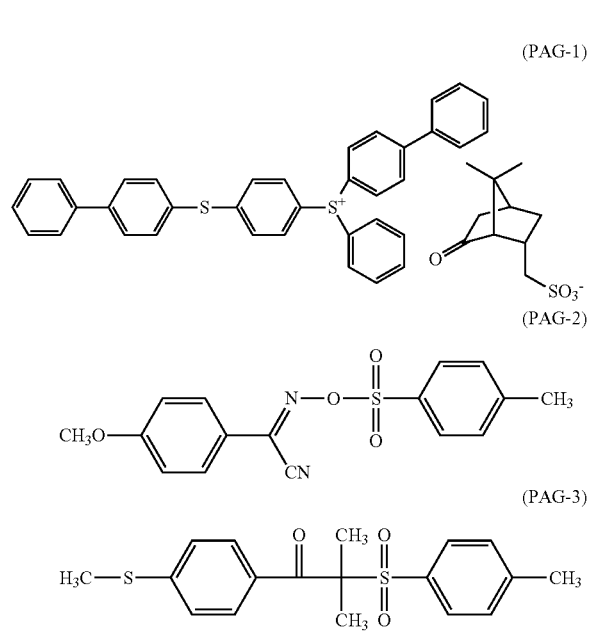

(PAG-1)

(PAG-2)

(PAG-3)

The crosslinking agent (component (D)) shown in Table 1 is as follows.

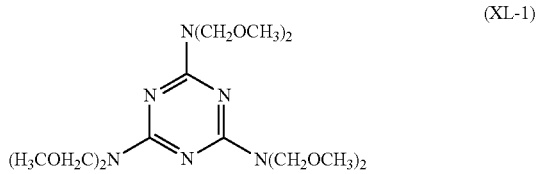

(XL-1)

The polyhydric phenol compound (component (E)) used in the examples of the present invention, shown in Table 1, is as follows.

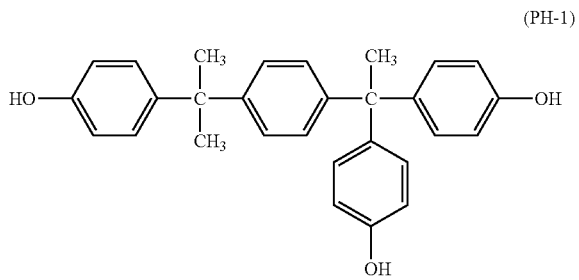 [SMILES: CC(C)(c1ccc(O)cc1)c1ccc(C(C)(c2ccc(O)cc2)c2ccc(O)cc2)cc1]

(PH-1)

The epoxy compound used in the comparative examples of the present invention, shown in Table 1 is as follows.

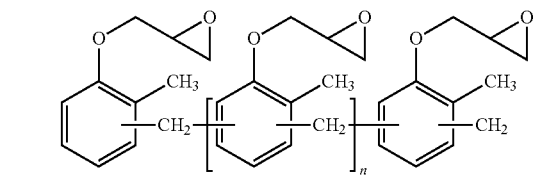

(EP-1)

The basic compound shown in Table 1 is as follows:

(AM-1)

U-CAT5002 shown in Table 1 is a curing accelerator available from San-Apro Ltd.

By using a die coater as the film coater and a polyethylene terephthalate film (with a thickness of 50 μm) as the supporting film, photo-curable resin compositions of Examples 1 to 4 and Comparative Examples 1 and 2 were each applied onto the supporting film. The film was caused to pass through a hot-air circulating oven (length of 4 m) at 100° C. over 8 minutes to form a photo-curable resin layer on the supporting film. A polyethylene film (with a thickness of 50 μm) was then laminated as the protective film on the photo-curable resin layer with a laminate roll under a pressure of 1 MPa to manufacture the photo-curable dry film. Table 2 shows the thickness of the photo-curable dry film. The thickness was measured with a thickness-measuring apparatus of contact type.

The protective film of the individual photo-curable dry films in Examples 1 to 4 and Comparative Examples 1 and 2 was delaminated. The photo-curable resin layer on the supporting film was then bonded to a silicon substrate on which a dummy semiconductor device of 100 mm square and 100 μm height had been placed with an applied temporary adhesive, by a vacuum laminator TEAM-100RF (manufactured by Takatori Corp.) with a vacuum degree in the vacuum chamber of 80 Pa. The temperature condition was 110° C. After the pressure was resumed to normal pressure, the substrate was taken out from the vacuum laminator, and the supporting film was delaminated. The thickness of the photo-curable resin layer bonded to the substrate was set to 150 μm. When the thickness of the photo-curable resin layer of the manufactured dry film was less than 150 μm, multiple films were bonded until the thickness of the photo-curable resin layer formed on the substrate reached 150 μm. A first photosensitive insulating layer was thereby formed on the substrate.

Subsequently, pre-baking was carried out with a hot plate at 130° C. for 5 minutes to improve adhesion to the substrate. The obtained first photosensitive insulating layer was exposed to light via a mask with an exposure apparatus, a contact aligner, equipped with a broad-band light source to form a pattern of opening on the electrode pad and opening for forming a through electrode provided outside the semiconductor device. After the photo-exposure, PEB was performed with a hot plate at 130° C. for 5 minutes, and the substrate was cooled and subjected to spray development with propylene glycol monomethyl ether acetate (PGMEA) for 600 seconds. The first photosensitive insulating layer on the substrate, in which the opening on the electrode pad on the semiconductor device and the opening for forming a through electrode provided outside the semiconductor device were formed by the above-mentioned method, was post-cured with an oven at 180° C. for 2 hours while purging with nitrogen. The elastic modulus at 25° C. of the cured first photosensitive insulating layer was measured with a dynamic viscoelasticity measuring apparatus (DMA). The linear expansion coefficient was measured with a linear expansion coefficient measuring apparatus (TMA). The tensile strength was measured in accordance with JIS K 7127. The result is given in Table 1.

After curing, seed layers were formed by sputtering with titanium, followed by copper. The opening on the electrode pad and the opening for forming a through electrode were then filled by plating with copper to form an on-semiconductor-device metal pad and a through electrode, respectively. The on-semiconductor-device metal pad and the through electrode formed by plating were connected through a metal interconnect formed by plating.

After forming the metal interconnect, the seed layers other than the metal interconnect portion were removed by wet etching. Further, the photo-curable resin compositions of Examples 1 to 4 and Comparative Examples 1 and 2 were each applied to form a second photosensitive insulating layer.

To effectively carry out the photo-curing reaction, pre-baking was performed with a hot plate at 100° C. for 2 minutes, and the solvent and the like were previously evaporated. After pre-baking, the second photosensitive insulating layer had a thickness of 15 µm. The pre-baked substrate was subjected to patterning to form an opening on the through electrode. The patterning was performed according to the above-mentioned exposure method of the photo-curable dry film. After the photo-exposure, PEB was performed at 130° C. for 2 minutes, and the substrate was cooled and subjected to spray development with PGMEA for 120 seconds.

After patterning for forming the opening on the through electrode, the pattern obtained by the patterning of the second photosensitive insulating layer was post-cured with an over at 180° C. for 2 hours while purging with nitrogen.

After curing, an on-through-electrode metal pad was formed in the opening on the through electrode by plating, and a solder ball was formed on the on-through-electrode metal pad, whereby a solder bump was formed.

After forming the solder bump, the substrate temporarily adhering to the semiconductor device was removed. The semiconductor device from which the substrate was removed was placed on a dicing film and diced into individual pieces. The semiconductor apparatus was thereby manufactured.

The degree of warpage of the apparatus edge with reference to the apparatus center was measured on the manufactured semiconductor apparatus. The result is given in Table 2.

To examine the reliability of the manufactured semiconductor apparatus, thermal cycle test (1 cycle: from −55° C. to 125° C., 10 minutes) was performed, and the appearance of the semiconductor apparatus was observed after the 1000th cycle.

TABLE 2

| | Thickness of first photosensitive insulating layer (µm) | Thickness of second photosensitive insulating layer (µm) | Warpage of semiconductor apparatus (µm) | Appearance of semiconductor apparatus after 1000th thermal cycle |
|---|---|---|---|---|
| Example 1 | 150 | 15 | 200 | No abnormalities |
| Example 2 | 150 | 15 | 180 | No abnormalities |
| Example 3 | 150 | 15 | 200 | No abnormalities |
| Example 4 | 150 | 15 | 175 | No abnormalities |
| Comparative Example 1 | 50 × 3 | 15 | 600 | Crack occurs |
| Comparative Example 2 | 75 × 2 | 15 | 400 | Crack occurs |

As shown in Table 2, the semiconductor apparatus including the first and second photosensitive insulating layers composed of the photo-curable resin composition containing the components (A) to (E) (Examples 1 to 4) showed reduced warpage and good result of thermal cycle test. Thus, the inventive semiconductor apparatus, in which warpage is reduced, can be easily placed on a circuit board and stacked. On the other hand, Comparative Examples 1 and 2, in which the component (A) does not satisfy requirements of the present invention, showed larger warpage than Examples 1 to 4, and cracks occurred after the thermal cycle test.

It should be noted that the present invention is not limited to the foregoing embodiment. The embodiment is just an exemplification, and any examples that have substantially the same feature and demonstrate the same functions and effects as those in the technical concept described in claims of the present invention are included in the technical scope of the present invention.

The invention claimed is:

1. A semiconductor apparatus comprising: a semiconductor device; an on-semiconductor-device metal pad electrically connected to the semiconductor device; a metal interconnect electrically connected to the semiconductor device; a through electrode electrically connected to the metal interconnect; a solder bump electrically connected to the metal interconnect; a first photosensitive insulating layer formed on the semiconductor device; and a second photosensitive insulating layer formed on the first photosensitive insulating layer, wherein the first photosensitive insulating layer and the second photosensitive insulating layer are composed of a photo-curable resin composition containing (A) a silicone polymer compound having an epoxy group-containing repeating unit shown by the following general formula (1) and a phenolic hydroxyl group-containing repeating unit shown by the following general formula (2), wherein the silicone polymer compound has a weight average molecular weight of 3,000 to 500,000 and satisfies $0.05 \leq J/(J+K) \leq 0.95$ where J is a mole of epoxy groups in the general formula (1) and K is a mole of phenolic hydroxyl groups in the general formula (2),

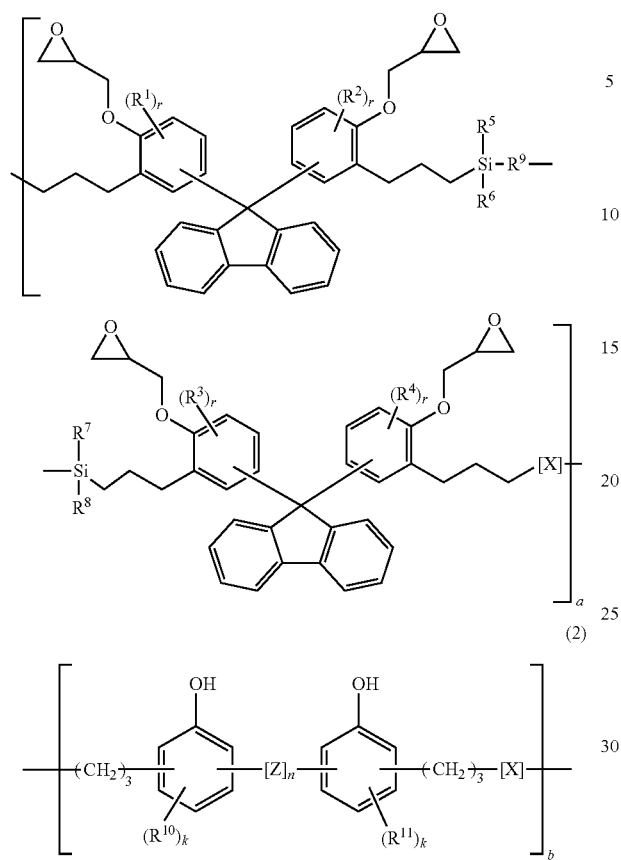

wherein a and b represent a positive number; $R^1$, $R^2$, $R^3$, and $R^4$ may be the same or different and represent a hydrogen atom or an alkyl or alkoxy group having 1 to 4 carbon atoms; r independently represents 0, 1, or 2; $R^5$ to $R^8$ independently represent a hydrogen atom or a monovalent hydrocarbon group having 1 to 10 carbon atoms; $R^9$ represents a divalent hydrocarbon group having 1 to 10 carbon atoms; n represents 0 or 1; k represents 0, 1, or 2; $R^{10}$ and $R^{11}$ may be the same or different and represent an alkyl or alkoxy group having 1 to 4 carbon atoms; Z represents a divalent organic group selected from any of $-CH_2-$, $-\underset{CH_3}{\overset{CH_3}{C}}-$, $-\underset{CF_3}{\overset{CF_3}{C}}-$,

[fluorene structure];

and X represents a divalent organic group shown by the following formula (3) or the following general formula (4),

[formula (3): $-\underset{CH_3}{\overset{CH_3}{Si}}-\underset{}{\overset{}{\text{C}_6\text{H}_4}}-\underset{CH_3}{\overset{CH_3}{Si}}-$]

$-\underset{R^{13}}{\overset{R^{12}}{Si}}-\left(O-\underset{R^{15}}{\overset{R^{14}}{Si}}\right)_m-$ (4)

wherein $R^{12}$, $R^{13}$, $R^{14}$, and $R^{15}$ may be the same or different and represent a monovalent hydrocarbon group having 1 to 10 carbon atoms; and m represents a positive number of 1 to 100, (B) a photosensitive acid generator capable of generating an acid by decomposition with light having a wavelength of 190 to 500 nm, (C) a solvent, (D) one or two or more compounds selected from an amino condensate modified with formaldehyde or formaldehyde-alcohol, a phenol compound having on average two or more methylol groups or alkoxymethylol groups per molecule, and a polyhydric phenol compound whose phenolic hydroxyl group is substituted with a glycidoxy group, and (E) one or two or more compounds selected from polyhydric phenols having 3 or more hydroxyl groups.

2. The semiconductor apparatus according to claim 1, wherein the photo-curable resin composition further contains (F) a basic compound.

3. The semiconductor apparatus according to claim 1, wherein a cured product of the photo-curable resin composition has an elastic modulus of 0.1 to 2 GPa and a tensile strength of 1 to 80 MPa.

4. The semiconductor apparatus according to claim 2, wherein a cured product of the photo-curable resin composition has an elastic modulus of 0.1 to 2 GPa and a tensile strength of 1 to 80 MPa.

5. The semiconductor apparatus according to claim 1, wherein the first photosensitive insulating layer is formed of a photo-curable dry film, and the second photosensitive insulating layer is formed of the photo-curable dry film or a photo-curable resist coating film.

6. A stacked semiconductor apparatus, comprising a plurality of semiconductor apparatuses according to claim 1, the semiconductor apparatuses being stacked by flip chip.

7. An encapsulated stacked-semiconductor apparatus, comprising a stacked semiconductor apparatus according to claim 6 placed on a substrate having an electric circuit, the stacked semiconductor apparatus being encapsulated with an insulating encapsulating resin layer.

8. A method for manufacturing a semiconductor apparatus, comprising the steps of:

(1) preparing a photo-curable dry film comprising a photo-curable resin layer sandwiched between a supporting film and a protective film, the photo-curable resin layer having a thickness of 10 to 300 m and being composed of a resist composition;

(2) forming a first photosensitive insulating layer by laminating the photo-curable resin layer of the photo-curable dry film on a substrate including a semiconductor device adhering or temporarily adhering to an upper surface of the substrate such that the semiconductor device is covered with the photo-curable resin layer, the semiconductor device having a height of 20 to 100 μm and including an exposed electrode pad;

(3) patterning the first photosensitive insulating layer by lithography through a mask to simultaneously form an opening on the electrode pad and an opening for forming a through electrode provided outside the semiconductor device;

(4) after patterning, baking a pattern obtained by the patterning of the first photosensitive insulating layer to cure the pattern;

(5) after curing, forming a seed layer by sputtering and then filling the opening on the electrode pad and the opening for forming a through electrode by plating to form an on-semiconductor-device metal pad and a through electrode respectively, and connecting the on-semiconductor-device metal pad and the through electrode formed by plating through a metal interconnect formed by plating;

(6) after forming the metal interconnect, forming a second photosensitive insulating layer by laminating the photo-curable resin layer of the photo-curable dry film or applying the resist composition, and patterning the second photosensitive insulating layer to form an opening on the through electrode;

(7) after patterning, baking a pattern obtained by the patterning of the second photosensitive insulating layer to cure the pattern; and (8) after curing, forming a solder bump in the opening on the through electrode, wherein
the resist composition constituting the photo-curable resin layer of the photo-curable dry film prepared in the step (1) is a chemically amplified negative resist composition containing (A) a silicone polymer compound having an epoxy group-containing repeating unit shown by the following general formula (1) and a phenolic hydroxyl group-containing repeating unit shown by the following general formula (2), wherein the silicone polymer compound has a weight average molecular weight of 3,000 to 500,000 and satisfies $0.05 \leq J/(J+K) \leq 0.95$ where J is a mole of epoxy groups in the general formula (1) and K is a mole of phenolic hydroxyl groups in the general formula (2), $R^5$ to $R^8$ independently represent a hydrogen atom or a monovalent hydrocarbon group having 1 to 10 carbon atoms; $R^9$ represents a divalent hydrocarbon group having 1 to 10 carbon atoms; n represents 0 or 1; k represents 0, 1, or 2; $R^{10}$ and $R^{11}$ may be the same or different and represent an alkyl or alkoxy group having 1 to 4 carbon atoms; Z represents a divalent organic group selected from any of

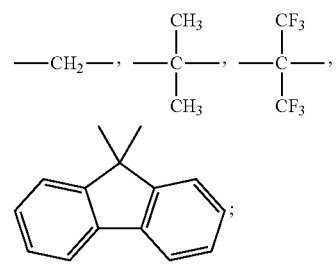

and X represents a divalent organic group shown by the following formula (3) or the following general formula (4),

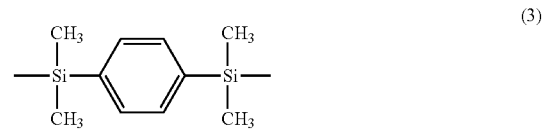

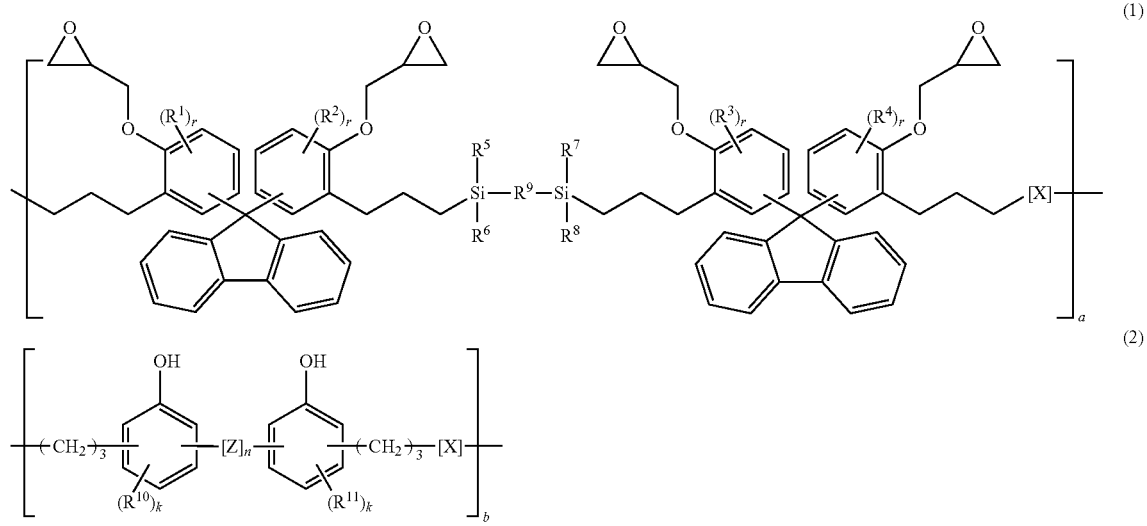

wherein a and b represent a positive number; $R^1$, $R^2$, $R^3$, and $R^4$ may be the same or different and represent a hydrogen atom or an alkyl or alkoxy group having 1 to 4 carbon atoms; r independently represents 0, 1, or 2;

wherein $R^{12}$, $R^{13}$, $R^{14}$, and $R^{15}$ may be the same or different and represent a monovalent hydrocarbon group having 1 to 10 carbon atoms; and m represents a positive number of 1 to 100, (B) a photosensitive acid generator capable of generating an acid by decomposition with light having a wavelength of 190 to 500 nm, (C) a solvent, (D) one or two or more compounds selected from an amino condensate modified with formaldehyde or formaldehyde-alcohol, a phenol compound having on average two or more methylol groups or alkoxymethylol groups per molecule, and a polyhydric phenol compound whose phenolic hydroxyl group is substituted with a glycidoxy group, and (E) one or two or more compounds selected from polyhydric phenols having 3 or more hydroxyl groups.

9. The method for manufacturing a semiconductor apparatus according to claim 8, wherein the resist composition further contains (F) a basic compound.

10. The method for manufacturing a semiconductor apparatus according to claim 8, wherein a cured product of the resist composition has an elastic modulus of 0.1 to 2 GPa and a tensile strength of 1 to 80 MPa.

11. The method for manufacturing a semiconductor apparatus according to claim 9, wherein a cured product of the resist composition has an elastic modulus of 0.1 to 2 GPa and a tensile strength of 1 to 80 MPa.

12. The method for manufacturing a semiconductor apparatus according to claim 8, wherein the step (2) includes mechanically pressing the first photosensitive insulating layer.

13. The method for manufacturing a semiconductor apparatus according to claim 8, wherein the step (8) includes forming an on-through-electrode metal pad in the opening on the through electrode by plating, and forming a solder ball on the on-through-electrode metal pad for the solder bump.

14. The method for manufacturing a semiconductor apparatus according to claim 8, wherein plating to form the through electrode in the step (5) includes plating with SnAg, the step (6) includes patterning to form the opening on the through electrode such that the SnAg plating is uncovered, and the step (8) includes melting the SnAg plating and thereby forming a protruding electrode in the opening on the through electrode for the solder bump.

15. The method for manufacturing a semiconductor apparatus according to claim 8, further comprising the steps of, after the step (8), removing the substrate, which has been temporarily adhered to the semiconductor device in the step (2), and after removing the substrate, dicing the semiconductor apparatus into individual pieces.

16. A method for manufacturing a stacked semiconductor apparatus, comprising stacking a plurality of individual semiconductor apparatuses obtained by dicing in the manufacturing method according to claim 15, while putting an insulting resin layer between the individual semiconductor apparatuses such that the individual semiconductor apparatuses are electrically connected through the solder bump.

17. A method for manufacturing an encapsulated stacked-semiconductor apparatus, comprising the steps of:

placing a stacked semiconductor apparatus manufactured by the manufacturing method according to claim 16 on a substrate having an electric circuit; and encapsulating the stacked semiconductor apparatus placed on the substrate with an insulating encapsulating resin layer.

* * * * *